(12) United States Patent
Morris et al.

(10) Patent No.: US 11,355,504 B2
(45) Date of Patent: Jun. 7, 2022

(54) ANTI-FERROELECTRIC CAPACITOR MEMORY CELL

(71) Applicant: Intel Corporation, Santa Clara, CA (US)

(72) Inventors: Daniel H. Morris, San Francisco, CA (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 861 days.

(21) Appl. No.: 15/994,227

(22) Filed: May 31, 2018

(65) Prior Publication Data

US 2019/0371802 A1 Dec. 5, 2019

(51) Int. Cl.
*G11C 11/22* (2006.01)
*H01L 27/11507* (2017.01)
*H01L 49/02* (2006.01)

(52) U.S. Cl.
CPC ...... *H01L 27/11507* (2013.01); *G11C 11/221* (2013.01); *G11C 11/2273* (2013.01); *G11C 11/2275* (2013.01); *H01L 28/55* (2013.01); *H01L 28/60* (2013.01)

(58) Field of Classification Search
CPC ... H01L 27/11507; H01L 28/55; H01L 28/60; G11C 11/221; G11C 11/2275
USPC ....................................................... 365/145
See application file for complete search history.

(56) References Cited

U.S. PATENT DOCUMENTS

| 5,218,568 A | 6/1993 | Lin et al. |
| 5,412,596 A | 5/1995 | Hoshiba |
| 5,515,311 A | 5/1996 | Mihara |
| 2006/0268597 A1 | 11/2006 | Sakuma |

(Continued)

FOREIGN PATENT DOCUMENTS

| JP | 2000243090 A | 9/2000 |
| WO | 2018111215 A1 | 6/2018 |
| WO | 2018125024 A1 | 7/2018 |

OTHER PUBLICATIONS

European Extended Search Report issued in European Application No. 19170430.3 dated Oct. 8, 2019; 10 pages.

(Continued)

*Primary Examiner* — Huan Hoang
(74) *Attorney, Agent, or Firm* — Patent Capital Group

(57) ABSTRACT

Described herein are anti-ferroelectric (AFE) memory cells and corresponding methods and devices. For example, in some embodiments, an AFE memory cell disclosed herein includes a capacitor employing an AFE material between two capacitor electrodes. Applying a voltage to one electrode of such capacitor allows boosting the charge at the other electrode, where nonlinear behavior of the AFE material between the two electrodes may advantageously manifest itself in that, for a given voltage applied to the first electrode, a factor by which the charge is boosted at the second electrode of the capacitor may be substantially different for different values of charge at that electrode before the boost. Connecting the second capacitor electrode to a storage node of the memory cell may then allow boosting the charge on the storage node so that different logic states of the memory cell become more clearly resolvable, enabling increased retention times.

25 Claims, 13 Drawing Sheets

(56) References Cited

U.S. PATENT DOCUMENTS

| | | |
|---|---|---|
| 2006/0284224 A1 | 12/2006 | Shuto |
| 2008/0048226 A1 | 2/2008 | Heo et al. |
| 2008/0121956 A1 | 5/2008 | Kanaya |
| 2010/0321975 A1 | 12/2010 | Kimura et al. |
| 2012/0113707 A1* | 5/2012 | Takemura ............... G11C 11/40 365/149 |
| 2012/0314476 A1 | 12/2012 | Appenzeller et al. |
| 2013/0264639 A1* | 10/2013 | Glass .................... H01L 29/086 257/335 |
| 2016/0027490 A1 | 1/2016 | Müller |
| 2016/0372478 A1 | 12/2016 | Ino et al. |
| 2017/0358684 A1* | 12/2017 | Chen .................. H01L 29/40111 |
| 2018/0122478 A1 | 5/2018 | Morris et al. |
| 2018/0277647 A1* | 9/2018 | Yoo ....................... H01L 29/516 |
| 2018/0374929 A1* | 12/2018 | Yoo ................... H01L 29/78391 |
| 2020/0144189 A1* | 5/2020 | Yoo ..................... H01L 23/5384 |

OTHER PUBLICATIONS

Pesic, Milan, et al., "Anti-Ferroelectric-Like Zr02 Non-Volatile Memory: Inducing Non-Volatility Within State-of-the-Art DRAM," 2017 17th Non-Volatile Memory Technology Symposium (NVMTS), IEEE; pp. 1-4 (Aug. 30, 2017).

Vopson, Melvin M. et al., "Four-State Anti-Ferroelectric Random Access Memory," IEEE Electron Device Letters, IEEE Service Center, New York, NY, US; vol. 37, No. 12; pp. 1551-1554 (Dec. 1, 2016).

International Search Report for PCT Application No. PCT/US2016/066056 dated Jul. 28, 2017 (10 pages).

International Search Report for PCT Application No. PCT/US2016/068615 dated Aug. 28, 2017 (12 pages).

Luk et al. "A Novel Dynamic Memory Cell With Internal Voltage Gain" (Apr. 2005) (pp. 884-894), vol. 40, No. 4, IEEE Journal of Solid-State Circuits.

* cited by examiner

ANTI-FERROELECTRIC CAPACITOR MEMORY CELL

BACKGROUND

Embedded memory is used in many different computer products. One type of embedded memory is embedded Dynamic Random Access Memory (embedded DRAM or E-DRAM), which is a DRAM integrated on the same die or multi-chip module of an application-specific integrated circuit or a microprocessor. Increased retention time and performance, and improvements with respect to dimensional scaling are desirable attributes for E-DRAM.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figure 1:
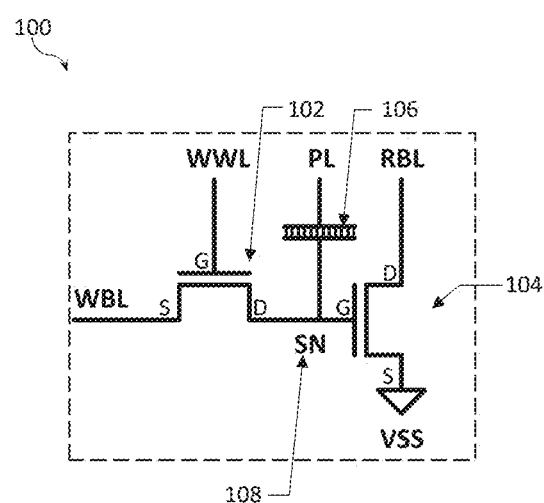
FIG. 1 is a schematic illustration of a two-transistor and one anti-ferroelectric (AFE) capacitor (2T-1AFE-CAP) memory cell, according to some embodiments of the present disclosure.

The performance of a memory cell may depend on the number of factors. One factor is a retention time of a cell, which refers to the minimum amount of time a cell is able to keep its charge inside of it, namely in a so-called "storage node," so that when the cell is read, the charge on the storage node is still interpreted correctly by the sense amplifier. For example, a memory cell having a retention time of 256 milliseconds (ms) is able to keep the correct information in a storage node for at least 256 ms.

The charge on a storage node of a memory cell can be used to represent one of a finite number of logic states that the cell can have, e.g., logic states "1" and "0," each state represented by a different charge (or a range of charges) on the storage node of the cell. In other words, the charge on the storage node represents information stored by the cell, encoded in the logic states. Increasing retention time of a cell is desirable because it increases the time information can be preserved.

Increasing retention time of embedded memory cells, e.g., of E-DRAM memory cells, is not trivial due to various challenges. One challenge results from inherent transistor leakage of various transistors that may be involved in an embedded cell. Another challenge is the limited amount of voltage that may be stored by a capacitor of a cell. Some previous solutions to increasing retention time of embedded memory cells included implementing various techniques for decreasing transistor leakage and integrating larger capacitors.

Described herein are anti-ferroelectric (AFE) memory cells and corresponding methods and devices. "AFE memory cell" refers to memory cells employing AFE materials. An AFE material is a material that can assume a state in which electric dipoles from the ions and electrons in the material may form a substantially ordered (e.g., substantially crystalline) array, with adjacent dipoles being oriented in opposite (antiparallel) directions (i.e., the dipoles of each orientation may form interpenetrating sub-lattices, loosely analogous to a checkerboard pattern). This can be contrasted with a ferroelectric (FE) material, which may assume a state in which all of the dipoles point in the same direction. In some aspects, AFE memory cells disclosed herein include at least a capacitor, referred to herein as an "AFE capacitor," that employs an AFE material between two capacitor electrodes (i.e., an AFE material is included in, or forms at least part of, the dielectric medium separating two electrodes of an AFE capacitor). Applying a voltage to one electrode of the AFE capacitor allows boosting (i.e., increasing/enhancing) the charge at the other electrode of the AFE capacitor, where nonlinear behavior of the AFE material between the two electrodes may advantageously manifest itself in that, for a given voltage applied to the first electrode, a factor by which the charge is boosted at the second electrode of the capacitor may be substantially different for different values of charge at that electrode before the boost. Connecting the second capacitor electrode to a storage node of a memory cell may then allow boosting the charge on the storage node so that different logic states (as represented by different charges on the storage node) become more clearly resolvable, which may advantageously increase retention time of the memory cell.

One example AFE memory cell disclosed herein may include one AFE capacitor as described above, as well as one access transistor (which may also be referred to as a "write transistor") and one read transistor, and, may, therefore, be referred to as "2T-1AFE-CAP memory cell." Each of the access transistor, read transistor, and the AFE capacitor may be coupled to a storage node. The access transistor may be configured to control charging or discharging of the storage node (i.e., the access transistor is for programming, or writing to, the memory cell), while the read transistor may be configured to sense the charge on the storage node (i.e., the read transistor is a read transistor for reading the memory cell).

Memory cells described herein may achieve one or more of a number of advantages. As described above, the nonlinear behavior of the AFE material in AFE capacitors may help increase retention times. Compared to other memory cells, device scalability may be increased. In some implementations, density of memory cells in a memory array may be increased (e.g., when non-planar transistor architecture is used to implement transistors of memory cells). Furthermore, compared to embedded memories which require extremely low-leakage transistors, proposed architecture allows minimizing the effect of access transistor leakage, thus advantageously allowing to relax requirements with respect to this leakage. Consequently, memory cells proposed herein may be particularly compatible with very short gate length technology nodes. Other technical effects will be evident from various embodiments described here.

While AFE memory cell arrangements are described with reference to the 2T-1AFE-CAP memory cell, embodiments of the present disclosure are not used to this particular arrangement and, in general, AFE capacitors can be used to boost storage node voltage before a READ operation, as described herein, in other types of memory cells. Furthermore, while AFE memory cell arrangements described herein may be particularly advantageous for implementing E-DRAM memory, embodiments of the present disclosure are not limited to only E-DRAM implementations. In general, AFE memory cell arrangements described herein may be implemented in one or more components associated with an IC or/and between various such components. In various embodiments, components associated with an IC include, for example, transistors, diodes, power sources, resistors, capacitors, inductors, sensors, transceivers, receivers, antennas, etc. Components associated with an IC may include those that are mounted on IC or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

For purposes of explanation, specific numbers, materials and configurations are set forth in order to provide a thorough understanding of the illustrative implementations. However, it will be apparent to one skilled in the art that the present disclosure may be practiced without the specific details or/and that the present disclosure may be practiced with only some of the described aspects. In other instances, well-known features are omitted or simplified in order not to obscure the illustrative implementations.

In the following detailed description, reference is made to the accompanying drawings that form a part hereof, and in which are shown, by way of illustration, embodiments that may be practiced. The accompanying drawings are not necessarily drawn to scale. For example, to clarify various layers, structures, and regions, the thickness of some layers may be enlarged. Furthermore, while drawings illustrating various structures/assemblies of example devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g., scanning electron microscopy (SEM) or transmission electron microscopy (TEM). In addition, the various structures/assemblies of the present drawings may further include possible processing defects, such as e.g., the rounding of corners, the drooping of the layers/lines, unintentional gaps and/or discontinuities, unintentionally uneven surfaces and volumes, etc., although these possible processing defects may not be specifically shown in the drawings. It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g., a layer, film, area, or plate) is in any way positioned on or over (e.g., positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

Furthermore, various aspects of the illustrative implementations may be described using terms commonly employed by those skilled in the art to convey the substance of their work to others skilled in the art. For example, as used herein, a "logic state" of a memory cell refers to one of a finite number of states that the cell can have, e.g., logic states "1" and "0," each state represented by a different value of at least one characteristic of the cell (e.g., by a different value of a charge stored in a storage node). In another example, as used herein, a "READ" and "WRITE" memory access or operations refer to, respectively, determining/sensing a logic state of a memory cell and programming/setting a logic state of a memory cell. In other examples, the terms "bit-cell" or simply "cell" may be used interchangeably with the term "memory cell," and the term "AFE material" may be used to cover embodiments where several different AFE materials are used. Still further, as used herein, the term "connected" may mean a direct electrical or magnetic connection between the things that are connected, without any intermediary devices, while the term "coupled" may mean either a direct electrical or magnetic connection between the things that are connected or an indirect connection through one or more passive or active intermediary devices. The term "circuit" may mean one or more passive and/or active components that are arranged to cooperate with one another to provide a desired function. In yet another example, a "high-k dielectric" refers to a material having a higher dielectric constant (k) than silicon oxide. The terms "oxide," "carbide," "nitride," etc. refer to compounds containing, respectively, oxygen, carbon, nitrogen, etc.

Example Memory Cell

FIG. 1 is a schematic illustration of a 2T-1AFE-CAP memory cell 100, according to some embodiments of the present disclosure. As shown, the 2T-1AFE-CAP cell 100 may include a first transistor 102, a second transistor 104, and an AFE capacitor 106, each of which may be coupled to a storage node (SN) 108.

Each of the transistors 102, 104 has a gate terminal, a source terminal, and a drain terminal, indicated in the example of FIG. 1 as terminals G, S, and D, respectively. However, as is commonly known, source and drain terminals are interchangeable in transistors. Therefore, while the example of FIG. 1 illustrates certain arrangement of source and drain terminals as indicated with the corresponding letters S and D, in other embodiments, source and drain terminals of one or both of the transistors 102, 104 of the memory cell 100 may be interchanged, compared to what is shown in FIG. 1. A source and a drain terminal of a transistor is sometimes referred to in the following as a "transistor terminal pair" or "source/drain (S/D) terminals."

The first transistor 102 may be configured to control charging or discharging of the storage node 108. Since the charge on the storage node 108 translates to a certain logic state of the memory cell 100 (i.e., the charge on the storage node 108 represents information stored by the memory cell 100), the first transistor 102 is a transistor that may be used for programming, or writing to, the memory cell 100, i.e., the first transistor 102 is an access/write transistor. To that end, as shown in FIG. 1, in the 2T-1AFE-CAP cell 100, the gate terminal of the first transistor 102 is coupled to a write wordline (WWL), one of the S/D terminals (e.g., the source terminal) of the first transistor 102 is coupled to a write bitline (WBL), and the other one of the S/D terminals (e.g., the drain terminal) of the first transistor 102 is coupled to the storage node 108.

The second transistor 104 may be configured to sense the charge on the storage node 108 to determine the logic state of the memory cell 100, i.e., the second transistor 104 is a read transistor for reading the memory cell 100. To that end, as shown in FIG. 1, in the 2T-1AFE-CAP cell 100, the gate terminal of the second transistor 104 is coupled to the storage node 108, one of the S/D terminals (e.g., the drain terminal) of the second transistor 104 is coupled to a read bitline (RBL), and the other one of the S/D terminals (e.g., the source terminal) of the second transistor 104 is coupled to the supply voltage VSS, e.g., to the most-negative supply voltage of the memory cell 100.

The AFE capacitor 106 may include a first and second capacitor electrodes, separated by a dielectric medium. Instead of a regular dielectric material used in conventional dielectric (i.e., not AFE) capacitors, the AFE capacitor 106 includes an AFE material (e.g., one or more different AFE materials). The first capacitor electrode of the AFE capacitor 106 may be coupled to a plate-line (PL), while the second capacitor electrode of the AFE capacitor 106 may be coupled to the storage node 108. Thus, the second capacitor electrode of the AFE capacitor 106 is coupled to the gate terminal of the second transistor 104, via the storage node 108 (i.e., the storage node 108 is readable via the second transistor 104). Similarly, the first S/D terminal of the first transistor 102 is coupled to the second capacitor electrode of the AFE capacitor 106 via the storage node 108 (i.e., the storage node is programmable via the first transistor 102).

The AFE material included in a dielectric medium of the AFE capacitor 106 may include one or more materials which exhibit sufficient AFE behavior even at thin dimensions as typically used in scaled integrated components as the ones illustrated here. Some examples of such materials known at the moment include materials including hafnium (Hf) and oxygen (O) (e.g., hafnium oxide), such as materials including Hf, O, and zirconium (Zr) (e.g., hafnium zirconium oxide (HfZrO), also referred to as HZO), and hafnium oxide doped with one or more of silicon (Si), aluminum (Al), yttrium (Y), gadolinium (Gd), germanium (Ge), lead (Pb), zirconium (Zr), titanium (Ti), tin (Sn), strontium (Sr), lanthanum (La), or niobium (Nb). For example, in various embodiments, the AFE material of the AFE capacitor 106 may include one or more of hafnium oxide, hafnium zirconium oxide, zirconium oxide, doped hafnium oxide with doping of Si, Al, Y, Gd, Ge, lead zirconate, $(Pb,Ba)ZrO_3$, $(Pb,Sr)ZrO_3$, $(Pb,La)(Zr_{1-y},Ti_y)O_3$, $(Pb_{0.97}La_{0.02})(Zr,Sn,Ti)O_3$ and $Pb_{0.99}(Zr,Sn,Ti)_{0.98}Nb_{0.02}O_3$. However, in other embodiments, any other materials which exhibit AFE behavior at thin dimensions may be used as the AFE material of the capacitor 106 and are within the scope of the present disclosure. The AFE material of the AFE capacitor 106 may have a thickness, a dimension measured e.g., in the direction of the z-axis of the reference coordinate system x-y-z shown in FIG. 3, that may, in some embodiments, be between 0.5 nanometers and 15 nanometers, including all values and ranges therein (e.g., between 1 and 10 nanometers, or between 1 and 5 nanometers).

In various embodiments, each of the first and second transistors 102, 104 may be any metal oxide semiconductor (MOS) transistors which include drain, source, and gate terminals. Embodiments of the present disclosure are explained below with reference to field-effect transistors (FET). However, in other embodiments, other transistors, for example, bi-polar junction transistors—BJT PNP/NPN, BiCMOS, CMOS, eFET, etc., may be used without departing from the scope of the disclosure. Furthermore, in various embodiments, access transistor described herein can have planar or non-planar architecture, as suitable for a particular implementation. Recently, transistors with non-planar architecture, such as e.g., FinFET transistors and all-around gate transistors, have been extensively explored as promising alternatives to transistors with planar architecture. Some embodiments of the present disclosure are explained below and illustrated with reference to the first and second transistors 102, 104 being FinFETs. However, in other embodiments, one or both of the first and second transistors 102, 104 may be implemented as non-planar transistors other than FinFETs, e.g., as all-around gate transistors, or may be implemented as planar transistors, such as single-gate or double-gate planar transistors, all of which being within the scope of the present disclosure.

Similarly, in various embodiments, the AFE capacitor 106 may be implemented using any suitable capacitor architecture, such as e.g., a parallel-plate capacitor. In some embodiments, the AFE capacitor 106 may have a three-dimensional geometry, e.g., be a cylindrical capacitor or a rectangular prism capacitor, possibly with rounded corners.

Still further, while embodiments of AFE memory cells are described with reference to 2T-1AFE-CAP memory cells as e.g., shown in FIG. 1, in other embodiments, any other memory architectures employing an AFE capacitor connected to a storage node and configured to enhance the voltage/charge on the storage node (due to the nonlinear behavior of the AFE material of the AFE capacitor) as a part of a READ operation of the storage node are within the scope of the present disclosure. For example in some embodiments, the transistor 104 of the 2T-1AFE circuit may be coupled with an additional (i.e., a third) transistor. In some embodiments, such an additional transistor may have a gate connection to the RWL. In some embodiments, such an additional transistor may have a drain coupled to the source of the transistor 104 and a source coupled to VSS. In other embodiments, such an additional transistor may have a drain coupled to RBL and a source coupled to the drain of the transistor 104. In these embodiments, the additional transistor may serve to further decrease leakage currents through cells on the inactivated read wordline.

Example FinFET

FinFETs refer to transistors having a non-planar architecture where a fin, formed of one or more semiconductor materials, extends away from a base. A portion of the fin that is closest to the base may be enclosed by a transistor dielectric material. Such a dielectric material, typically an oxide, is commonly referred to as a "shallow trench isolation" (STI), and the portion of the fin enclosed by the STI is typically referred to as a "subfin portion" or simply a "subfin." A gate stack that includes at least a layer of a gate electrode metal and a layer of a gate dielectric may be provided over the top and sides of the remaining upper portion of the fin (i.e., the portion above and not enclosed by the STI), thus wrapping around the upper-most portion of the fin. The portion of the fin over which the gate stack wraps around may be referred to as a "channel portion" of the fin and is a part of an active region of the fin. A source region and a drain region are provided on either side of the gate stack, forming, respectively, a source and a drain of a transistor.

FinFETs may be implemented as "tri-gate transistors," where the name "tri-gate" originates from the fact that, in use, such a transistor may form conducting channels on three "sides" of the fin. FinFETs potentially improve performance relative to single-gate transistors and double-gate transistors.

Figure 2:
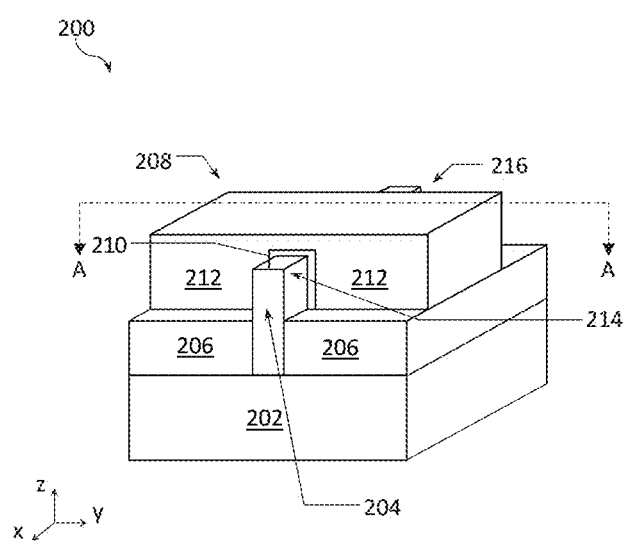
FIG. 2 is a perspective view of an example transistor that may be used in a 2T-1AFE-CAP memory cell, according to some embodiments of the present disclosure.

FIG. 2 is a perspective view of an example FinFET 200 that may be used as the first transistor 102 or/and the second transistor 104 in the 2T-1AFE-CAP memory cell 100, according to some embodiments of the disclosure. Note that the FinFET 200 shown in FIG. 2 is intended to show relative arrangement(s) of some of the components therein, and that the FinFET 200, or portions thereof, may include other components that are not illustrated (e.g., any further materials, such as e.g., spacer materials, surrounding the gate stack of the FinFET 200; electrical contacts to the source and the drain of the FinFET 200; etc.).

As shown, the FinFET 200 may include a base 202, a fin 204, a transistor dielectric material 206 enclosing the subfin portion of the fin 204, and a gate stack 208 that includes a gate dielectric 210 (which could include a stack of one or more gate dielectric materials) and a gate electrode material 212 (which could include a stack of one or more gate electrode materials). FIG. 2 further indicates S/D regions (also commonly referred to as "diffusion regions") 214 and 216 of the FinFET 200.

In general, implementations of the present disclosure may be formed or carried out on a substrate, such as a semiconductor substrate composed of semiconductor material systems including, for example, N-type or P-type materials systems. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V, group II-VI, or group IV materials. Although a few examples of materials from which the substrate may be formed are described here, any material that may serve as a foundation upon which a semiconductor device implementing any of the AFE memory cells as described herein may be built falls within the spirit and scope of the present disclosure. In various embodiments the base 202 may include any such substrate material that provides a suitable surface for forming the FinFET 200, or, in general, any AFE memory cell as described herein, e.g., the 2T-1AFE-CAP memory cell 100.

As shown in FIG. 2, the fin 204 may extend away from the base 202 and may be substantially perpendicular to the base 202. The fin 204 may include one or more semiconductor materials, e.g., a stack of semiconductor materials, so that the upper-most portion of the fin (namely, the portion of the fin 204 enclosed by the gate stack 208) may serve as the channel region of the FinFET 200.

The transistor dielectric material 206 forms an STI enclosing the sides of the fin 204. A portion of the fin 204 enclosed by the STI 206 forms a subfin. In various embodiments, the STI material 206 may be a low-k or high-k dielectric including but not limited to elements such as hafnium, silicon, oxygen, nitrogen, titanium, tantalum, lanthanum, aluminum, zirconium, barium, strontium, yttrium, lead, scandium, niobium, and zinc. Further examples of dielectric materials that may be used in the STI material 206 may include, but are not limited to silicon nitride, silicon oxide, silicon dioxide, silicon carbide, silicon nitride doped with carbon, silicon oxynitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate.

Above the subfin portion of the fin 204, the gate stack 208 may wrap around the fin 204 as shown in FIG. 2, with a channel portion of the fin 204 corresponding to the portion of the fin 204 wrapped by the gate stack 208. In particular, the gate dielectric 210 may wrap around the upper-most portion of the fin 204, and the gate electrode material 212 may wrap around the gate dielectric 210. The interface between the channel portion and the subfin portion of the fin 204 is located proximate to where the gate electrode 212 ends.

The gate electrode material 212 may include at least one P-type work function metal or N-type work function metal, depending on whether the FinFET 200 is a P-type metal oxide semiconductor (PMOS) transistor or an N-type metal oxide semiconductor (NMOS) transistor (P-type work function metal used as the gate electrode 212 when the FinFET 200 is a PMOS transistor and N-type work function metal used as the gate electrode 212 when the FinFET 200 is an NMOS transistor). For a PMOS transistor, metals that may be used for the gate electrode material 212 may include, but are not limited to, ruthenium, palladium, platinum, cobalt, nickel, and conductive metal oxides (e.g., ruthenium oxide). For an NMOS transistor, metals that may be used for the gate electrode material 212 include, but are not limited to, hafnium, zirconium, titanium, tantalum, aluminum, alloys of these metals, and carbides of these metals (e.g., hafnium carbide, zirconium carbide, titanium carbide, tantalum carbide, and aluminum carbide). In some embodiments, the gate electrode material 212 may include a stack of two or more material, e.g., metal, layers. Further layers may be included next to the gate electrode material 212 for other purposes, such as to act as a diffusion barrier layer or/and an adhesion layer.

In some embodiments, the gate dielectric 210 may include one or more high-k dielectrics including any of the materials discussed herein with reference to the STI material 206. In some embodiments, an annealing process may be carried out on the gate dielectric 210 during manufacture of the FinFET 200 to improve the quality of the gate dielectric 210. The gate dielectric 210 may have a thickness, a dimension measured in the direction of the y-axis on the sidewalls of the fin 204 and a dimension measured in the direction of the z-axis on top of the fin 204 (the y- and z-axes being different axes of a reference coordinate system x-y-z shown in FIG. 2), that may, in some embodiments, be between 0.5 nanometers and 3 nanometers, including all values and ranges therein (e.g., between 2 and 3 nanometers, or between 2 and 2 nanometers). In some embodiments, the gate stack 208 may be surrounded by a gate spacer, not specifically shown in FIG. 2. The gate spacer is configured to provide separation between the gate stacks 208 of different FinFETs 200 and typically is made of a low-k dielectric material.

In some embodiments, the fin 204 may be composed of semiconductor material systems including, for example, N-type or P-type materials systems. In some embodiments, the fin 204 may include a high mobility oxide semiconductor material, such as tin oxide, antimony oxide, indium oxide, indium tin oxide, titanium oxide, zinc oxide, indium zinc oxide, gallium oxide, titanium oxynitride, ruthenium oxide, or tungsten oxide. In some embodiments, the fin 204 may include a combination of semiconductor materials where one semiconductor material is used for the channel portion and another material, sometimes referred to as a "blocking material," is used for at least a portion of the subfin portion of the fin 204. In some embodiments, the subfin and the channel portions of the fin 204 are each formed of monocrystalline semiconductors, such as e.g., Si or Ge. In a first embodiment, the subfin and the channel portion of the fin 204 are each formed of compound semiconductors with a first sub-lattice of at least one element from group III of the periodic table (e.g., Al, Ga, In), and a second sub-lattice of at least one element of group V of the periodic table (e.g., P, As, Sb). The subfin may be a binary, ternary, or quaternary III-V compound semiconductor that is an alloy of two, three, or even four elements from groups III and V of the periodic table, including boron, aluminum, indium, gallium, nitrogen, arsenic, phosphorus, antimony, and bismuth.

For example N-type transistor embodiments (i.e., for the embodiments where the FinFET 200 is an N-type transistor), the channel portion of the fin 204 may advantageously include a III-V material having a high electron mobility, such as, but not limited to InGaAs, InP, InSb, and InAs. For some such embodiments, the channel portion of the fin 204 may be a ternary III-V alloy, such as InGaAs, GaAsSb, InAsP, or InPSb. For some $In_xGa_{1-x}As$ fin embodiments, In content (x) may be between 0.6 and 0.9, and may advantageously be at least 0.7 (e.g., $In_{0.7}Ga_{0.3}As$). In some embodiments with highest mobility, the channel portion of the fin 204 may be an intrinsic III-V material, i.e., a III-V semiconductor material not intentionally doped with any electrically active impurity. In alternate embodiments, a nominal impurity dopant level may be present within the channel portion of the fin 204, for example to further fine-tune a threshold voltage Vt, or to provide HALO pocket implants, etc. Even for impurity-doped embodiments however, impurity dopant level within the channel portion of the fin 204 is relatively low, for example below $10^{15}$ dopant atoms per cubic centimeter ($cm^{-3}$), and advantageously below $10^{13}$ $cm^{-3}$. The subfin portion of the fin 204 may be a III-V material having a band offset (e.g., conduction band offset for N-type devices) from the channel portion. Example materials, include, but are not limited to, GaAs, GaSb, GaAsSb, GaP, InAlAs, GaAsSb, AlAs, AlP, AlSb, and AlGaAs. In some N-type transistor embodiments of the FinFET 200 where the channel portion of the fin 204 is InGaAs, the subfin may be GaAs, and at least a portion of the subfin may also be doped with impurities (e.g., P-type) to a greater impurity level than the channel portion. In an alternate heterojunction embodiment, the subfin and the channel portion of the fin 204 are each group IV semiconductors (e.g., Si, Ge, SiGe). The subfin of the fin 204 may be a first elemental semiconductor (e.g., Si or Ge) or a first SiGe alloy (e.g., having a wide bandgap).

For example P-type transistor embodiments (i.e., for the embodiments where the FinFET 200 is a P-type transistor), the channel portion of the fin 204 may advantageously be a group IV material having a high hole mobility, such as, but not limited to Ge or a Ge-rich SiGe alloy. For some example embodiments, the channel portion of the fin 204 has a Ge content between 0.6 and 0.9, and advantageously is at least 0.7. In some embodiments with highest mobility, the channel portion is intrinsic III-V (or IV for P-type devices) material and not intentionally doped with any electrically active impurity. In alternate embodiments, one or more a nominal impurity dopant level may be present within the channel portion of the fin 204, for example to further set a threshold voltage Vt, or to provide HALO pocket implants, etc. Even for impurity-doped embodiments however, impurity dopant level within the channel portion is relatively low, for example below $10^{15}$ $cm^{-3}$, and advantageously below $10^{13}$ cm$^{-3}$. The subfin of the fin 204 may be a group IV material having a band offset (e.g., valance band offset for P-type devices) from the channel portion. Example materials, include, but are not limited to, Si or Si-rich SiGe. In some P-type transistor embodiments, the subfin of the fin 204 is Si and at least a portion of the subfin may also be doped with impurities (e.g., N-type) to a higher impurity level than the channel portion.

The fin 204 may include a source region 214 and a drain region 216 (which may be interchanged) on either side of the gate stack 208, as shown in FIG. 2, thus realizing a transistor. As is well known in the art, source and drain regions are formed for the gate stack of each MOS transistor. Although not specifically shown in FIG. 2, the FinFET 200 may further include source and drain electrodes, formed of one or more electrically conductive materials, for providing electrical connectivity to the source and drain regions 214, 216, respectively. S/D regions of the FinFET 200 (also sometimes interchangeably referred to as "diffusion regions") are regions of doped semiconductors, e.g., regions of doped channel material, so as to supply charge carriers for the transistor channel. Often, the S/D regions are highly doped, e.g., with dopant concentrations of about $1 \cdot 10^{21}$ cm$^{-3}$, in order to advantageously form Ohmic contacts with the respective S/D electrodes, although these regions may also have lower dopant concentrations and may form Schottky contacts in some implementations. Irrespective of the exact doping levels, the S/D regions 214, 216 are the regions having dopant concentration higher than in other regions, e.g., higher than a dopant concentration in a region between the source region 214 and the drain region 216, and, therefore, may be referred to as "highly doped" (HD) regions. In some embodiments, the source and drain regions may generally be formed using either an implantation/diffusion process or an etching/deposition process. In the former process, dopants such as boron, aluminum, antimony, phosphorous, or arsenic may be ion-implanted into the fin 204 to form the source and drain regions. An annealing process that activates the dopants and causes them to diffuse further into the fin 204 typically follows the ion implantation process. In the latter process, the fin stack 204 may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. Although not specifically shown in the perspective illustration of FIG. 2, in further embodiments, one or more layers of metal and/or metal alloys are typically used to form the source and drain contacts.

The FinFET 200 may have a gate length (i.e., a distance between the source region 214 and the drain region 216), a dimension measured along the fin 204 in the direction of the x-axis of the example reference coordinate system x-y-z shown in FIG. 2, which may, in some embodiments, be between 5 and 40 nanometers, including all values and ranges therein (e.g., between 22 and 35 nanometers, or between 20 and 30 nanometers). The fin 204 may have a thickness, a dimension measured in the direction of the y-axis of the reference coordinate system x-y-z shown in FIG. 2, that may, in some embodiments, be between 5 and 30 nanometers, including all values and ranges therein (e.g., between 7 and 20 nanometers, or between 20 and 25 nanometers). The fin 204 may have a height, a dimension measured in the direction of the z-axis of the reference coordinate system x-y-z shown in FIG. 2, which may, in some embodiments, be between 30 and 350 nanometers, including all values and ranges therein (e.g., between 30 and 200 nanometers, between 75 and 250 nanometers, or between 250 and 300 nanometers).

Although the fin 204 illustrated in FIG. 2 is shown as having a rectangular cross section in a z-y plane of the reference coordinate system shown in FIG. 2, the fin 204 may instead have a cross section that is rounded or sloped at the "top" of the fin 204, and the gate stack 208 may conform to this rounded or sloped fin 202. In use, the FinFET 200 may form conducting channels on three "sides" of the channel portion of the fin 204, potentially improving performance relative to single-gate transistors (which may form conducting channels on one "side" of a channel material or substrate) and double-gate transistors (which may form conducting channels on two "sides" of a channel material or substrate).

Sharing Elements for Increased Density

In some embodiments, at least portions of some of the elements of the memory cell 100 may be shared among two or more adjacent memory cells, advantageously enabling improved density of the memory array. An example of it is shown in FIG. 3, illustrating a cross-sectional side view of an example arrangement 300 where gates of two read transistors 104 of adjacent memory cells 100 are coupled to an AFE capacitor 106 such that the first capacitor electrode that is coupled to the PL is shared between the two memory cells 100.

In the memory cell arrangement 300, a transistor 200-1 is a first instance of the FinFET 200 of FIG. 2 and a transistor 200-2 is a second instance of the FinFET 200 of FIG. 2, each of which transistors is an example of the read transistor 104 of two adjacent memory cells 100. The cross-sectional side view of FIG. 3 is the view in the y-z plane of the example coordinate system shown in FIG. 2 with the cross section taken across the fins 204 (e.g., along the plane shown in FIG. 2 as a plane AA), with the same reference numerals used to indicate similar or analogous elements as those shown in FIG. 2 for a single FinFET 200. Various elements are shown in FIG. 3 with different patterns, where the correspondence between reference numerals and patterns for each of the elements shown at the bottom of FIG. 3.

Figure 3:
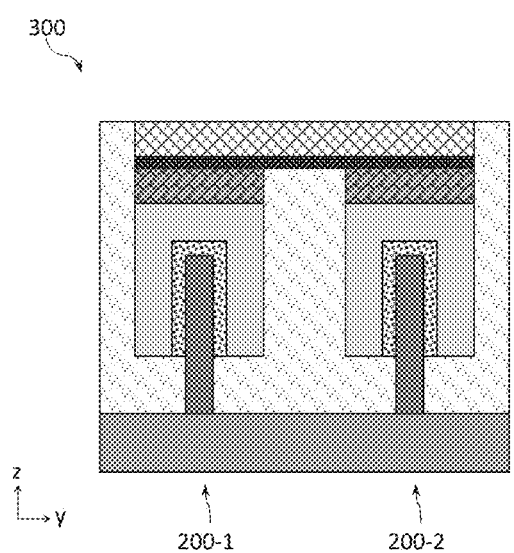
FIG. 3 is a cross-sectional side view of an example arrangement of a 2T-1AFE-CAP memory cell implementing transistors as shown in FIG. 2, according to some embodiments of the present disclosure.
Figure 3:
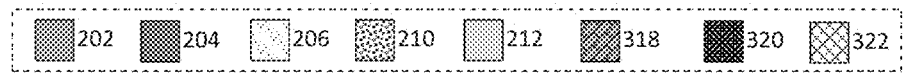

As shown in FIG. 3, in some embodiments, some of the elements of the individual FinFETs of the memory cell arrangement 300 may be shared between the first and second FinFETs 200-1 and 200-2: for example, in FIG. 3, the base 202 and the STI 206 are shown to be shared among the first and second FinFETs 200-1 and 200-2 (in other embodiments of the memory cell 300, any of these elements do not have to be shared). As also shown in FIG. 3, other elements may be provided individually for each of the first and second FinFETs 200-1 and 200-2 shown in FIG. 3, e.g., each FinFET of the memory cell 300 includes a respective fin 204, and a respective gate stack of the gate dielectric 210 and the gate electrode 212.

As shown in FIG. 3, the gate stacks of individual FinFETs 200-1 and 200-2 may be provided in openings in the STI 206, with the STI 206 electrically isolating individual FinFETs 200 from one another. In some embodiments, all of the dielectric material shown in FIG. 3 as the STI 206 may be implemented as the STI described with reference to FIG. 2. In other embodiments, the dielectric material 206 of the memory cell 300 may include the STI enclosing the subfin portions of the fins 204 of the first and second FinFETs 200, and a gate spacer material enclosing the upper portions of the fins 204, where the gate spacer may be a different dielectric material from the STI. Thus, in such embodiments, the openings in which gate stacks of the first and second FinFETs 200 may be formed may be provided in the gate spacer material above the STI that surrounds the fin portions of these transistors. In some embodiments, such a gate spacer may be made of one or more low-k dielectric materials. Examples of low-k materials that may be used to form such a gate spacer may include, but are not limited to, fluorine-doped silicon dioxide, carbon-doped silicon dioxide, spin-on organic polymeric dielectrics such as e.g., polyimide, polynorbornenes, benzocyclobutene, and polytetrafluoroethylene (PTFE), or spin-on silicon based polymeric dielectric such as e.g., hydrogen silsesquioxane (HSQ) and methylsilsesquioxane (MSQ)). Other examples of low-k materials that may be used in a gate spacer include various porous dielectric materials, such as for example porous silicon dioxide or porous carbon-doped silicon dioxide, where large voids or pores are created in a dielectric in order to reduce the overall dielectric constant of the layer, since voids can have a dielectric constant of nearly 1. When such a gate spacer is used, then, similar to the FinFET 200 shown in FIG. 2, the lower portions of the fins 204 of the first and second FinFETs 200 in the memory cell 300, i.e., the subfin portions of the fins, may be surrounded by the STI 206 which may e.g., include any of the high-k dielectric materials described herein.

As further shown in FIG. 3, in the embodiment of the memory cell arrangement 300, the AFE capacitor 106 of two adjacent memory cells 100 may be implemented as having capacitor electrodes 318 and 322, separated by a dielectric medium comprising an AFE material 320, where the top capacitor electrode 322 is shared between capacitors of the adjacent memory cells. Thus, FIG. 3 illustrates that, for each memory cell, an individual bottom capacitor electrode 318 is coupled to the gate 212 of the read FinFETs 200-1, 200-2 of different memory cells.

Example Array of Memory Cells

Figure 4:
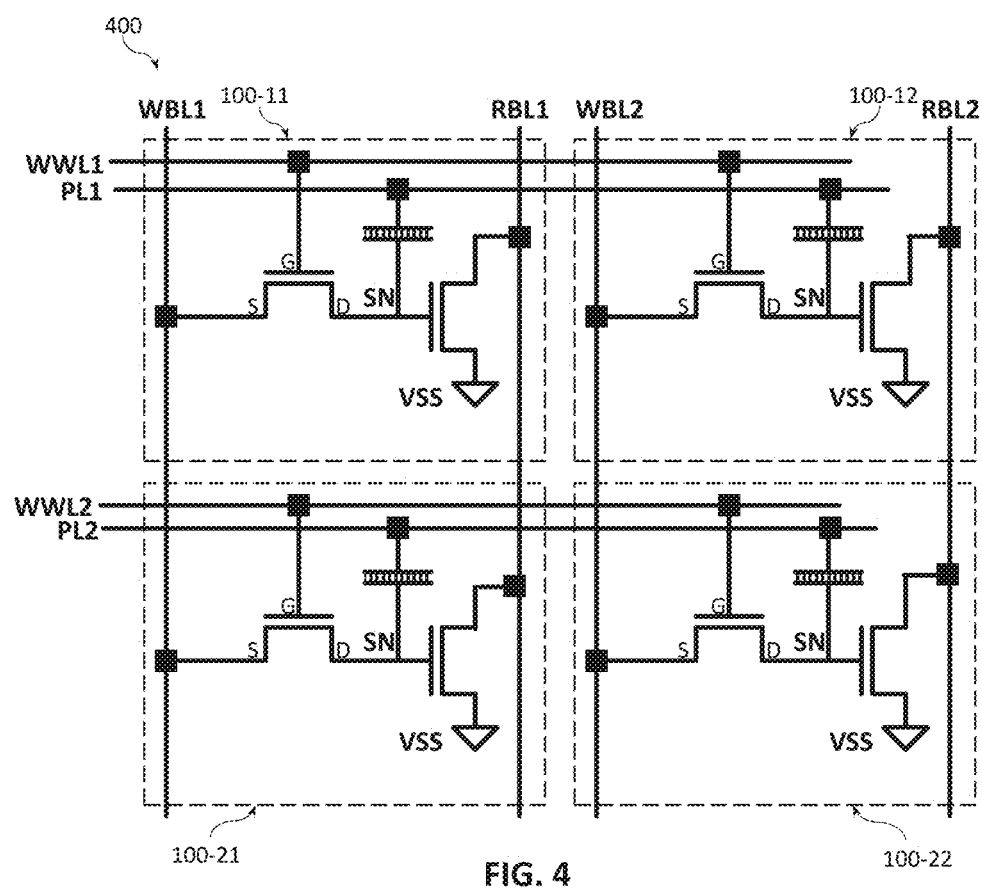
FIG. 4 is a schematic illustration of a plurality of 2T-1AFE-CAP memory cells arranged in an array, according to some embodiments of the present disclosure.

FIG. 4 is a schematic illustration of a plurality of 2T-1AFE-CAP memory cells, namely four cells, arranged in an array 400, according to some embodiments of the present disclosure. Each memory cell shown in FIG. 4 could be any one of the 2T-1AFE-CAP memory bit-cells as described herein. While only four such memory cells are shown in FIG. 4, in other embodiments, the array 400 may, and typically would, include many more memory cells. Furthermore, in other embodiments, the 2T-1AFE-CAP memory cells as described herein may be arranged in arrays in other manners as known in the art, all of which being within the scope of the present disclosure.

FIG. 4 illustrates that, in some embodiments, PL and WWL can be shared among multiple memory cells 100 in a column (each 2T-1AFE-CAP memory cell 100 as described herein illustrated in FIG. 4 to be within a dashed box labeled 100-11, 100-12, 100-21, and 100-22), and that WBL and RBL can be shared among multiple memory cells 100 in a row. As is conventionally used in context of memory, the terms "row" and "column" do not necessarily reflect the, respectively, horizontal and vertical orientation on a page of a drawing illustrating a memory array but, instead, reflect on how individual memory cells are addressed. Namely, memory cells 100 sharing a single WWL are said to be in the same row, while memory cells sharing a single WBL are said to be on the same column. Thus, in FIG. 4, the horizontal lines refer to rows while vertical lines refer to columns. Different instances of each line (WWL, PL, WBL, and RBL) are indicated in FIG. 4 with different reference numerals, e.g., WWL1 and WWL2 are the two different instances of the WWL as described herein, PL1 and PL2 are the two different instances of the PL as described herein, and so on. The same reference numeral in the labels used for different lines WBL and RBL indicates that those lines are used to address/control the memory cells in a single column, e.g., WBL1 and RBL1 are used to address/control the memory cells 100 in column 1 (i.e., the memory cells 100-11 and 100-21, shown in FIG. 4), and so on. The same reference numeral in the labels used for different lines WWL and PL indicates that those lines are used to address/control the memory cells in a single row, e.g., WWL1 and PL1 are used to address/control the memory cells 100 in column 1 (i.e., the memory cells 100-11 and 100-12, shown in FIG. 4), and so on. Each memory cell 100 may then be addressed by using the WWL and PL corresponding to the row of the cell and by using the WBL and RBL corresponding to the column of the cell. For example, the memory cell 100-11 is controlled by WWL1, PL1, WBL1, and RBL1, the memory cell 100-12 is controlled by WWL1, PL1, WBL2, and RBL2, and so on.

The array 400 provides just one example embodiment of how a plurality of 2T-1AFE-CAP memory cells 100 may be arranged. Such an embodiment may be particularly advantageous because providing PL lines substantially parallel to the WWL lines may improve the ON/OFF ratio of bitline currents. Furthermore, by capacitively coupling the gate of the read transistor to the PL oriented parallel to the WWL, the voltage on the storage node may be increased just for those cells on the selected wordline. In other embodiments, how a plurality of 2T-1AFE-CAP memory cells 100 may be arranged in different manners. For example, the PL may be parallel to the RBL.

Example READ and WRITE Operations

Figure 5:
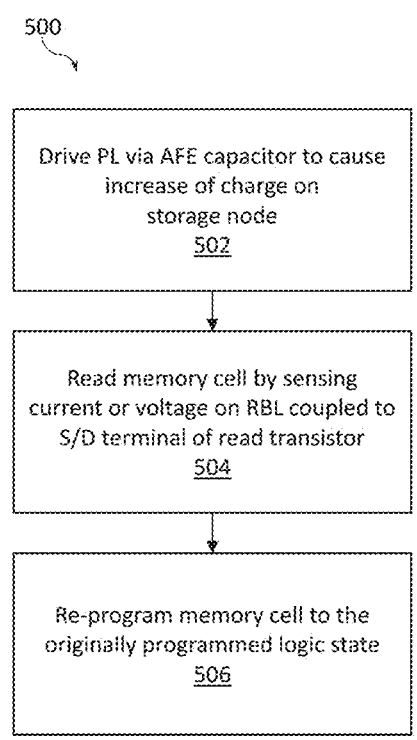
FIG. 5 is a flow diagram of an example method for reading an AFE-CAP memory cell, in accordance with various embodiments of the present disclosure.
Figure 6:
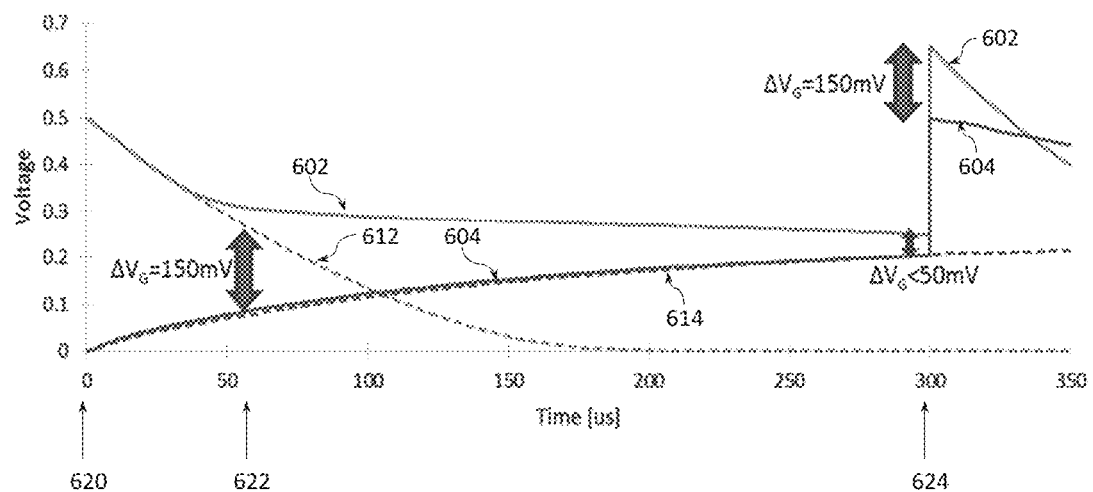
FIG. 6 is an illustration of an improved read signal and retention in a 2T-1AFE-CAP memory cell, according to some embodiments of the present disclosure.
Figure 7:
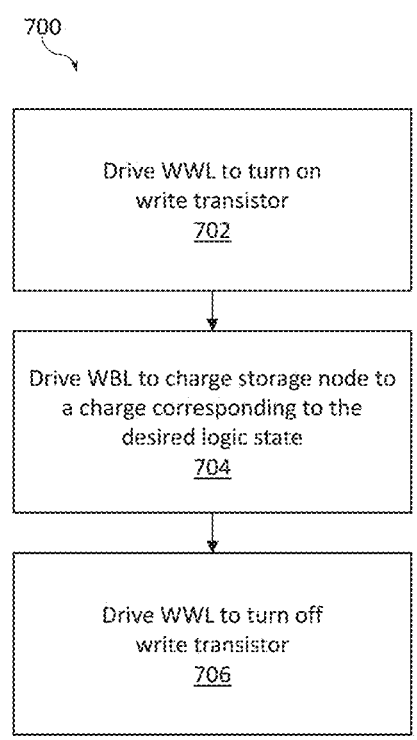
FIG. 7 is a flow diagram of an example method for programming an AFE-CAP memory cell, in accordance with various embodiments of the present disclosure.

Next, methods of operating the 2T-1AFE-CAP memory cell as described herein will be explained, with reference to associated FIGS. In particular, FIGS. 5 and 6 illustrate a READ operation, while FIG. 7 illustrates a WRITE operation.

FIG. 5 is a flow diagram of an example method 500 for reading an AFE-CAP memory cell, in accordance with various embodiments of the present disclosure. While the method 500 is described with reference to reading a 2T-1AFE-CAP memory cell such as e.g., the 2T-AFE-CAP memory cell 100, in general, based on the descriptions provided herein, the method 500 may be adapted to read any AFE-CAP memory cell, all of which embodiments being within the scope of the present disclosure.

Turning to the READ method 500, as shown in FIG. 5, the method 500 may begin at 502 with driving the PL via the AFE capacitor 106 to cause increase of charge on the storage node 108. Driving the PL at 502 may include applying a suitable voltage to the first capacitor electrode of the AFE capacitor 106 to increase charge on the storage node 108 that is coupled to the second capacitor electrode of the AFE capacitor 106 (as shown in FIG. 1). In some embodiments, the PL may be driven at 502 by applying a voltage between about 0.2 and 1.2 volts, including all values and ranges therein. In some embodiments, driving of the PL at 502 may include transitioning the PL from voltage/logic "low" to voltage/logic "high." Duration of application of voltage to the PL is described below.

How the application of voltage to the PL of the 2T-1AFE-CAP memory cell 100 results in charge increase on the storage node 108 may be explained as follows. When a periphery circuit drives the PL to increase PL voltage, e.g., by applying a certain voltage to the PL, the AFE capacitor 106 capacitively couples the rising PL node (i.e., the first capacitor electrode to which increased voltage has been applied) to the storage node 108. As a result of this capacitive coupling, the charge that was stored on the storage node 108 as a part of the storage node 108 storing a certain logic state of the memory cell 100 is redistributed. In particular, the charge on the storage node 108 may be redistributed based on the charge-vs-voltage characteristics of the AFE capacitor 106 and the gate terminal of the read transistor 104, as well as, possibly, on various parasitic charges that may be associated with the storage node 108. In this process, voltage on the storage node 108 increases for both the memory cell 100 that was originally in a logic state "1" (i.e., for memory cells 100 where the storage node 108 was pre-charged to a voltage corresponding to the logic state "1") and the memory cell 100 that was originally in a logic state "0" (i.e., for memory cells 100 where the storage node 108 was pre-charged to a voltage corresponding to the logic state "0"). However, because the coupling is nonlinear due to the nonlinear behavior of the AFE material of the AFE capacitor 106, the non-linearity causes greater voltage increase on the storage node 108 for memory cells in which the storage node 108 was originally pre-charged to a higher voltage. Therefore, the original logic state that was associated with a higher pre-charge on the storage node 108 becomes a "stronger" logic state in that the difference in charge from that logic state to the other logic state becomes more pronounced (i.e., the difference becomes greater). As a result, it is possible to wait longer time before reading the memory cell, as even after such a time, by boosting the voltage on the storage node 108 due to the nonlinear behavior of the AFE capacitor 106, the difference between two logic states is still sufficiently large so that the two logic states can be differentiated. Thus, the retention time of the memory cell may be increased. This will now be explained again with reference to the illustration of FIG. 6.

FIG. 6 is an illustration of one example of an improved READ signal and retention in a 2T-1AFE-CAP memory cell, according to some embodiments of the present disclosure, and will be referred to below as a part of describing the method 500. In FIG. 6, the x-axis illustrates time, measured in microseconds (us), while the y-axis illustrates voltage on the storage node 108, measured in volts (V). The lighter solid line 602, shown in FIG. 6, illustrates voltage on the storage node 108 that was originally pre-charged to a certain voltage corresponding to a first logic state (i.e., thus the solid line 602 is for the example 2T-1AFE-CAP memory cell 100 according to any of the embodiments described herein). The lighter dashed line 612 illustrates voltage on a storage node that was originally pre-charged to the same voltage corresponding to the first logic state for a conventional E-DRAM. The darker solid line 604, shown in FIG. 6, illustrates voltage on the storage node 108 that was originally pre-charged to a certain voltage corresponding to a second logic state (i.e., thus the solid line 604 is for the example 2T-1AFE-CAP memory cell 100 according to any of the embodiments described herein). The darker dashed line 614 illustrates voltage on a storage node that was originally pre-charged to the certain voltage corresponding to the second logic state of a conventional E-DRAM. As illustrated in the example of FIG. 6, the first logic state is associated with the storage node being pre-charged to the voltage of 0.5 volts, while the second logic state is associated with the storage node being pre-charged to the voltage of 0 volts. For purposes of discussion, it can be assumed that pre-charge to the voltage of 0.5 volts is associated with a logic state "1" while pre-charge to the voltage of 0 volts is associated with a logic state "0" (i.e., high voltage for logic state "1" and low voltage for logic state "0"), although in other embodiments, the "1" and "0" states may be reversed, and, furthermore, the voltage values of the original pre-charge may be different (e.g., one logic state may be associated with a pre-charge of a storage node to 1 volts, while another logic state may be associated with a pre-charge of a storage node to 0.2 volts).

As can be observed from FIG. 6, for any memory cell, the original pre-charge voltage (as indicated in FIG. 6 with the time 620) for both logic states dissipates overtime (as shown in FIG. 6 with the charge associated with what is assumed to be a logic state "1" decreasing, as shown with the lines 602 and 612, and the charge associated with what is assumed to be a logic state "0" increasing, as shown with the lines 604 and 614). Assuming that the difference between the charge on the storage node of a memory cell when the memory cell can still be read (i.e., when the two logic states can be reliably differentiated from one another) is about 150 millivolts (mV), the retention time of a conventional E-DRAM memory cell is slightly more than 50 us (as indicated in FIG. 6 with the time 622), since after that time the difference between the line 612 and 614 is less than that minimum difference. Now, the original pre-charge of the first and second logic states also dissipates for the 2T-AFE-CAP memory cells as described herein, as shown with the lines 602 and 604. However, first of all, architecture of the 2T-AFE-CAP memory cells as described herein may enable dissipation of the charge associated with the logic state with a higher pre-charge (i.e., the assumed logic state "1") to be slower, as shown in FIG. 6 with the line 602 going down at a slower pace than the line 612 for the conventional E-DRAM. Second of all, the nonlinear nature of the AFE material of the AFE capacitor 106 allows waiting longer time and, thus, allowing the pre-charge of a certain logic state on the storage node to dissipate more, before the charge on the storage node is boosted but in such a manner that a higher original charge on the storage node is increased by a larger factor than a lower original charge. This is shown in FIG. 6 with the time 624: at time 624 (which may e.g., be around 300 us, as shown in FIG. 6), the difference between the lines 602 and 604 may be less than 50 mV (as indicated in FIG. 6), which normally would not be enough for differentiating between logic states represented by these two charges. However, if a voltage is applied to the PL at that time (i.e., at the time 624), it would boost the charge on the storage node 108. Whether the storage node 108 has the charge remaining from the pre-charge to the logic state "1" (i.e., the voltage as indicated with the line 602 at the point 624) or the charge remaining from the pre-charge to the logic state "0" (i.e., the voltage as indicated with the line 604 at the point 624), this charge is increased as a result of increasing the voltage on the PL, with the higher original charge on the storage node 108 being increased by a larger factor than the lower original charge. Thus, as shown in FIG. 6 with the lines 602 and 604 after the time 624 (both of which lines illustrating a jump after the time 624), as a result of applying voltage to the PL at the time 624, the difference between the charge associated with the logic state "1" and the charge on the storage node 108 associated with the logic state "0" becomes greater—FIG. 6 illustrating this difference becoming about 150 mV, which is enough to differentiate between the logic states. Thus, FIG. 6 illustrates that a retention time of a memory cell may be increased, e.g., to the time 624 shown in FIG. 6, which is about 300 us, because of the use of the AFE capacitor 106 to boost the voltage on the storage node 108.

Because the storage node 108 is coupled to the gate terminal of the read transistor 104 (as shown in FIG. 1), the voltage on the storage node 108 modulates (i.e., affects/changes) the current between the source and drain terminals of the read transistor 104. Therefore, turning back to the method 500, once the voltage on the storage node 108 has been boosted by application of the voltage to the PL at 502, the current or voltage may be sensed on the RBL at 504 (because the RBL is connected to a S/D terminal of the read transistor 104), e.g., by a sense amplifier connected to the RBL. Since even the boosted voltage on the storage node 108 will dissipate over time, preferably the sensing of the current or voltage on the RBL at 504 takes place relatively soon after the application of voltage on the PL at 502, e.g., within about 100 picosecond to 1 microsecond. In general, the larger the voltage applied to the PL at 502, the more time may be allowed to pass before sensing on the RBL at 504, since larger voltage applied to the PL at 502 would result in larger voltage difference between two logic states. The current or voltage sensed on the RBL at 504 is indicative of the voltage at the gate terminal of the read transistor 104, which, in turn, is indicative of the logic state of the memory cell 100 as represented by the charge on the storage node 108. Therefore, sensing the current or voltage on the RBL at 504 allows detecting the logic state of the memory cell 100, thus accomplishing the READ operation.

Since accomplishing the READ operation as described above changes the charge on the storage node 108, in some embodiments, as shown in FIG. 5, the method 500 may further include re-programming the memory cell to the originally programmed logic state at 506. For the example shown in FIG. 6, this might mean charging the storage node 108 to the voltage of 0.5 V if the logic state read at 504 was determined to be the logic state "1" or discharging the storage node 108 to the voltage of 0 V if the logic state read at 504 was determined to be the logic state "0." In general, programming the memory cell 100 to a first logic state may mean ensuring that the storage node 108 is charged to a certain first voltage, while programming the memory cell 100 to a second logic state may mean ensuring that the storage node 108 is charged to a certain second voltage, different from the first voltage. The re-programming of the memory cell at 506 may be carried out substantially in the same way that the memory cell 506 is programmed/written to in the first place, as described with reference to FIG. 7.

FIG. 7 is a flow diagram of an example method 700 for writing to (i.e., for programming) an AFE-CAP memory cell, in accordance with various embodiments of the present disclosure. While the method 700 is described with reference to reading a 2T-1AFE-CAP memory cell such as e.g., the 2T-AFE-CAP memory cell 100, in general, based on the descriptions provided herein, the method 700 may be adapted to program any AFE-CAP memory cell, all of which embodiments being within the scope of the present disclosure.

As shown in FIG. 7, the method 700 may begin with driving the WWL to turn on the write transistor 102 at 702. Driving the WWL at 702 may include asserting the WWL (e.g., transitioning the WWL from voltage/logic "low" to voltage/logic "high" to turn on the write transistor 102), e.g., by applying voltage sufficient to turn on the transistor 102. In some embodiments, such a voltage may e.g., be about 1.0 V. Once the write transistor 102 is switched on, current can flow through it, between the S/D terminals of the write transistor 102. Because the storage node 108 is connected in series with the write transistor 102 (namely, to one of the S/D terminals of the write transistor 102), if current flows through the write transistor 102, then charge can accumulate on the storage node 108. Therefore, at 704 of the method 700, the WBL, connected to one S/D terminal of the write transistor 102 is driven to charge or discharge the storage node 108, connected to the other S/D terminal of the write transistor 102, to a charge corresponding to the desired logic state being programmed. For the example described above, this might mean ensuring that the storage node 108 is charged/discharged (depending on which voltage was on the storage node 108 before) to the voltage of 0.5 V if the logic state to be written to the memory cell 100 using the method 700 is the logic state "1" or ensuring that the storage node 108 is charged/discharged to the voltage of 0 V if the logic state to be written to the memory cell 100 using the method 700 is the logic state "0."

The method 700 may conclude with driving the WWL to turn off the write transistor 102 at 706. Driving the WWL at 706 may include de-asserting the WWL (e.g., transitioning the WWL from voltage/logic "high" to voltage/logic "low" to turn off the write transistor 102), e.g., by stopping application of voltage that was applied to turn on the transistor 102, or/and by applying a different voltage.

Figure 8:
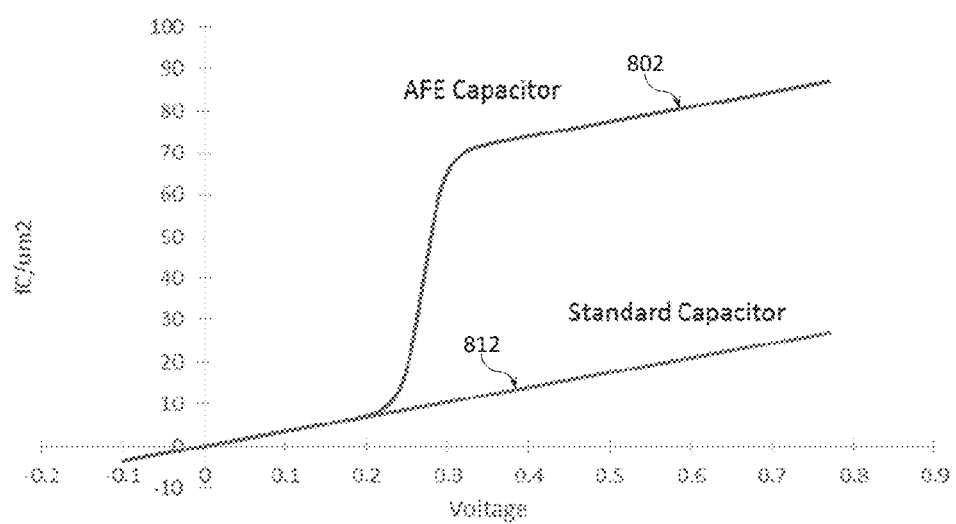
FIG. 8 illustrates charge that may be stored in an AFE capacitor vs. charge stored in a standard capacitor.

As the foregoing illustrates, the use of an AFE capacitor in a memory cell allows increasing retention time of the cell. FIG. 8 illustrates the charge stored at the AFE capacitor (line 802) vs. the charge stored at a standard (i.e., non-AFE) capacitor (line 804). In FIG. 8, the x-axis illustrates voltage on the storage node 108, measured in V, while the y-axis illustrates charge on the AFE capacitor 106, measured in femtocoulombs (fC) per square micrometer (um$^2$) (fC/um$^2$). As FIG. 8 illustrates, in some embodiments, the AFE capacitor 106 may be highly nonlinear between about 200 mV and 400 mV (these values may vary in other embodiments). In such embodiments, the AFE capacitor 106 may be charged above about 400 mV for logic state "1" and below about 200 mV for logic state "0." At the beginning of a READ operation, the PL is switched to a higher voltage (502 of the method 500). Charge may then rush off the AFE capacitor 106 and onto parasitic gate capacitance (of the gate of the read transistor 104) inside the memory cell 100. This charge-share internal to the memory cell 100 may then cause data-dependent voltage gain inside the memory cell. A relatively smaller initial voltage difference across the AFE capacitor 106 may be boosted to a larger voltage difference as the operating point shifts from around the nonlinear portion AFE curve 802 to the linear portion of the AFE curve 802. This internal gain is seen at the time 624 indicated in FIG. 6. At the time 624, the PL switches to a higher voltage and the initial 50 mV voltage difference becomes 150 mV. An additional advantage of such implementation is that the higher gate bias (i.e., the higher voltage at the gate terminal of the read transistor 104), e.g., a higher gate bias above about 600 mV may enable the memory cell 100 to sink higher current from the RBL, compared to the non-AFE capacitor DRAM.

Example Manufacturing of AFE Memory Cells

Figure 9:
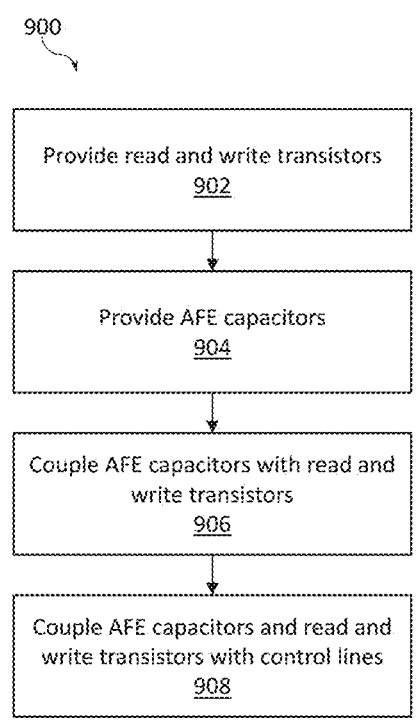
FIG. 9 is a flow diagram of an example method for manufacturing an AFE-CAP memory cell, in accordance with various embodiments of the present disclosure.

The AFE-CAP memory cells, in particular the 2T-1AFE-CAP memory cells 100, disclosed herein may be manufactured using any suitable techniques. For example, FIG. 9 is a flow diagram of an example method 900 of manufacturing a 2T-1AFE-CAP memory cell, in accordance with various embodiments. Although the operations of the method 900 are illustrated once each and in a particular order, the operations may be performed in any suitable order and repeated as desired. For example, one or more operations may be performed in parallel e.g., to manufacture multiple 2T-1AFE-CAP memory cells substantially simultaneously, or/and to manufacture the transistors and the AFE capacitors of the 2T-1AFE-CAP memory cells substantially simultaneously. In another example, the operations may be performed in a different order to reflect the structure of a memory device in which the 2T-1AFE-CAP memory cell will be included.

At 902, read and write transistors may be provided over a substrate. Each of the read and write transistors provided at 902 may include a channel, and gate, source, and drain terminals which may take the form of any of the embodiments of, respectively, the read transistor 104 and the write transistor 102 disclosed herein (e.g., any of the embodiments discussed herein with reference to a FinFET used to implement these read and write transistors). The channel material, gate electrode material, and source and drain regions of the access transistor may be provided at 902 using any suitable deposition and patterning techniques known in the art, such as e.g., atomic layer deposition (ALD), chemical vapor deposition (CVD), physical vapor deposition (PVD) and various lithographic techniques such as e.g., photolithography or electron-beam lithography.

At 904, an AFE capacitor may be provided over a substrate. The AFE capacitor may include an AFE material, which may include a stack of materials, provided between a pair of capacitor electrodes, and may take the form of any of the embodiments of the AFE capacitor 106 disclosed herein (e.g., any of the embodiments discussed herein with reference to a single AFE capacitor 106 having one plate shared among transistors of different memory cells, as shown in FIG. 3). The AFE material and the first and second electrodes of the AFE capacitor may be provided at 904 using any suitable deposition and patterning technique known in the art.

At 906, the read and write transistors may be coupled to the AFE capacitor. Such coupling may take the form of any of the embodiments of the read and write transistors 104, 102 coupled to the AFE capacitor 106 disclosed herein (e.g., any of the embodiments discussed herein with reference to a source/drain terminal of the write transistor 102 being coupled to one of the electrodes of the AFE capacitor 106 and any of the embodiments discussed herein with reference to a gate terminal of the read transistor 104 being coupled to the same electrode of the AFE capacitor 106). The coupling may be provided at 906 using any suitable techniques known in the art.

At 908, the two transistors and the AFE capacitor may be coupled to READ and/or WRITE control lines. Such coupling may take the form of any of the embodiments of the write transistor 102, the read transistor 104, and the AFE capacitor 106 coupled to the WWL, WBL, PL, and RBL disclosed herein. The coupling may be provided at 908 using any suitable techniques known in the art.

The method 900 may further include other manufacturing operations related to fabrication of other components of the 2T-1AFE-CAP cell 100.

Example Devices and Apparatuses

The AFE-CAP memory cells, e.g., the 2T-1AFE-CAP memory cells, disclosed herein may be included in any suitable electronic device. FIGS. 10A-10B and FIGS. 11-13 illustrate various examples of apparatuses that may include one or more of the AFE-CAP memory cells, e.g., the 2T-1AFE-CAP memory cells, disclosed herein.

Figures 10A, 10B:
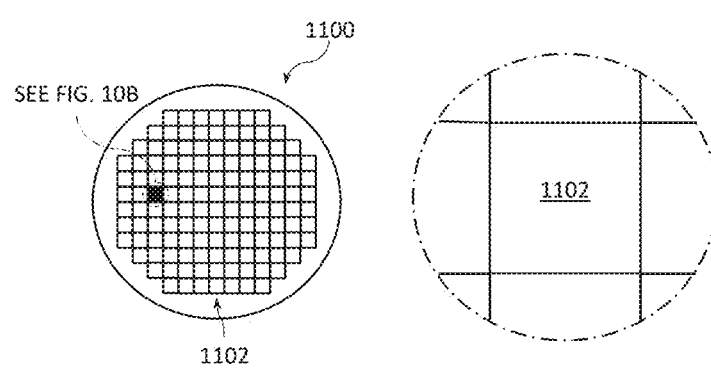
FIGS. 10A and 10B are top views of a wafer and dies that include one or more AFE-CAP memory cells in accordance with any of the embodiments disclosed herein.

FIGS. 10A-B are top views of a wafer 1100 and dies 1102 that may include one or more AFE-CAP memory cells, e.g., one or more 2T-1AFE-CAP memory cells, in accordance with any of the embodiments disclosed herein. The wafer 1100 may be composed of semiconductor material and may include one or more dies 1102 having IC structures formed on a surface of the wafer 1100. Each of the dies 1102 may be a repeating unit of a semiconductor product that includes any suitable IC (e.g., ICs including AFE capacitors that form one or more AFE-CAP memory cells, e.g., AFE capacitors 106 that form one or more 2T-1AFE-CAP memory cells 100). After the fabrication of the semiconductor product is complete (e.g., after manufacture of an array of AFE-CAP memory cells, such as e.g., the array 400), the wafer 1100 may undergo a singulation process in which each of the dies 1102 is separated from one another to provide discrete "chips" of the semiconductor product. In particular, devices that include one or more AFE-CAP memory cells as disclosed herein may take the form of the wafer 1100 (e.g., not singulated) or the form of the die 1102 (e.g., singulated). The die 1102 may include one or more memory devices (e.g., one or more of the memory 1404 of FIG. 13, discussed below, which may take the form of any AFE-CAP memory cell, e.g., any 2T-1AFE-CAP memory cell 100, or an array of such memory cells) and/or supporting circuitry to route electrical signals to the memory cells, transistors, as well as any other IC components. In some embodiments, the wafer 1100 or the die 1102 may include other transistor devices, a logic device (e.g., an AND, OR, NAND, or NOR gate), or any other suitable circuit element. Multiple ones of these devices may be combined on a single die 1102. For example, a memory array formed by multiple memory devices may be formed on a same die 1102 as a processing device (e.g., the processing device 1402 of FIG. 11) or other logic that is configured to store information in the memory devices or execute instructions stored in the memory array.

Figure 11:
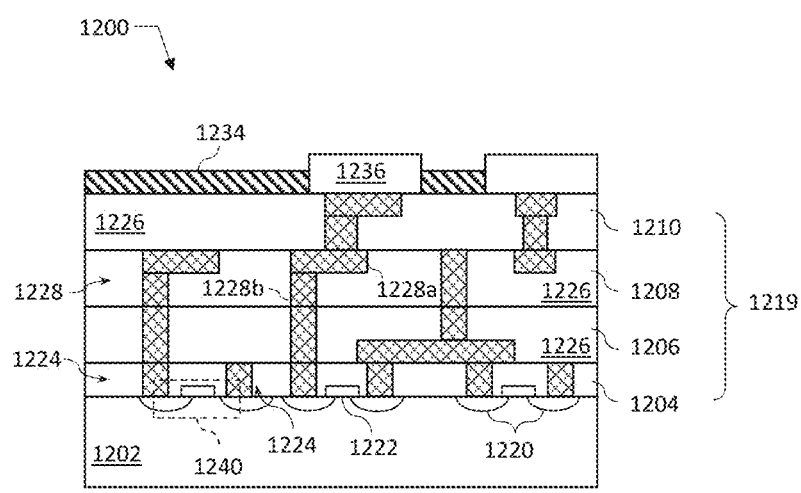
FIG. 11 is a cross-sectional side view of an integrated circuit (IC) device that may include one or more AFE-CAP memory cells in accordance with any of the embodiments disclosed herein.

FIG. 11 is a cross-sectional side view of an IC device 1200 that may include one or more AFE-CAP memory cells, e.g., one or more 2T-1AFE-CAP memory cells, in accordance with any of the embodiments disclosed herein. The IC device 1200 may be formed on a substrate 1202 (e.g., the wafer 1100 of FIG. 10A) and may be included in a die (e.g., the die 1102 of FIG. 10B). The substrate 1202 may be a semiconductor substrate composed of semiconductor material systems including, for example, N-type or P-type materials systems. The substrate 1202 may include, for example, a crystalline substrate formed using a bulk silicon or a silicon-on-insulator substructure. In some embodiments, the semiconductor substrate 1202 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the substrate 1202. Although a few examples of materials from which the substrate 1202 may be formed are described here, any material that may serve as a foundation for an IC device 1200 may be used. The substrate 1202 may be part of a singulated die (e.g., the dies 1102 of FIG. 10B) or a wafer (e.g., the wafer 1100 of FIG. 10A).

The IC device 1200 may include one or more device layers 1204 disposed on the substrate 1202. The device layer 1204 may include features of one or more transistors 1240 (e.g., MOSFETs) formed on the substrate 1202. The device layer 1204 may include, for example, one or more S/D regions 1220, a gate 1222 to control current flow in the transistors 1240 between the S/D regions 1220, and one or more S/D contacts 1224 to route electrical signals to/from the S/D regions 1220. The transistors 1240 may include additional features not depicted for the sake of clarity, such as device isolation regions, gate contacts, and the like. The transistors 1240 are not limited to the type and configuration depicted in FIG. 11 and may include a wide variety of other types and configurations such as, for example, planar transistors, non-planar transistors, or a combination of both. Non-planar transistors may include FinFET transistors, e.g., double-gate transistors or tri-gate FinFET transistors, and wrap-around or all-around gate transistors, e.g., nanoribbon and nanowire transistors. In particular, one or more of the transistors 1240 may form one or more AFE-CAP memory cells, e.g., one or more 2T-1AFE-CAP memory cells 100, in accordance with any of the embodiments disclosed herein. For example, any transistor 1240 may take the form of any of the write transistors 102 or read transistors 104 disclosed herein (e.g., any of the FinFET transistors discussed herein with reference to FIGS. 2-3). The S/D regions 1220 may include the regions 214 and 216, described herein with reference to FIG. 2. Thin-film transistors 1240 implementing AFE-CAP memory cells, e.g., one or more 2T-1AFE-CAP memory cells 100, may be particularly advantageous when used in a microprocessor device, logic circuitry, or memory circuitry, and may be formed along with existing CMOS processes.

Each transistor 1240 may include a gate 1222 formed of at least two layers, a gate dielectric layer and a gate electrode layer. The gate electrode layer may take the form of any of the embodiments of the gate electrode material 212 disclosed herein. The gate dielectric layer may take the form of any of the embodiments of the gate dielectric material 210 disclosed herein. Generally, the gate dielectric layer of a transistor 1240 may include one layer or a stack of layers, and the one or more layers may include silicon oxide, silicon dioxide, and/or a high-k dielectric material. The high-k dielectric material included in the gate dielectric layer of the transistor 1240 may take the form of any of the embodiments of the high-k dielectric 210 disclosed herein, for example.

In some embodiments, when viewed as a cross section of the transistor 1240 along the source-channel-drain direction, the gate electrode may include a U-shaped structure that includes a bottom portion substantially parallel to the surface of the substrate and two sidewall portions that are substantially perpendicular to the top surface of the substrate (e.g., as is the case for the FinFETs 200 of FIGS. 2-3). In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin 204 discussed with reference to FIGS. 2-3 does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 1220 may be formed within the substrate 1202 adjacent to, or at a certain distance from, the gate 1222 of each transistor 1240. The S/D regions 1220 may take the form of any of the embodiments of the regions 214/216 discussed above with reference to the FinFET 200. In various embodiments, the S/D regions 1220 may be formed using any suitable processes known in the art. For example, the S/D regions 1220 may be formed using either an implantation/diffusion process or a deposition process. In the former process, dopants such as boron, aluminum, antimony, phosphorous, or arsenic may be ion-implanted into the substrate 1202 to form the S/D regions 1220. An annealing process that activates the dopants and causes them to diffuse farther into the substrate 1202 may follow the ion implantation process. In the latter process, an epitaxial deposition process may provide material that is used to fabricate the S/D regions 1220. In some implementations, the S/D regions 1220 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 1220 may be formed using one or more alternate semiconductor materials such as germanium or a group III-V material or alloy. In further embodiments, one or more layers of metal and/or metal alloys may be used to form the S/D regions 1220 (e.g., as discussed above with reference to the regions 214/216 discussed above with reference to the FinFET 200). In some embodiments, an etch process may be performed before the epitaxial deposition to create recesses in the substrate 1202 in which the material for the S/D regions 1220 is deposited.

Electrical signals, such as power and/or input/output (I/O) signals, may be routed to and/or from the transistors 1240 of the device layer 1204 through one or more interconnect layers disposed on the device layer 1204 (illustrated in FIG. 11 as interconnect layers 1206-1210). For example, electrically conductive features of the device layer 1204 (e.g., the gate 1222 and the S/D contacts 1224) may be electrically coupled with the interconnect structures 1228 of the interconnect layers 1206-1410. The one or more interconnect layers 1206-1210 may form an interlayer dielectric (ILD) stack 1219 of the IC device 1200.

The interconnect structures 1228 may be arranged within the interconnect layers 1206-1210 to route electrical signals according to a wide variety of designs (in particular, the arrangement is not limited to the particular configuration of interconnect structures 1228 depicted in FIG. 11). Although a particular number of interconnect layers 1206-1210 is depicted in FIG. 11, embodiments of the present disclosure include IC devices having more or fewer interconnect layers than depicted.

In some embodiments, the interconnect structures 1228 may include trench structures 1228a (sometimes referred to as "lines") and/or via structures 1228b (sometimes referred to as "holes") filled with an electrically conductive material such as a metal. The trench structures 1228a may be arranged to route electrical signals in a direction of a plane that is substantially parallel with a surface of the substrate 1202 upon which the device layer 1204 is formed. For example, the trench structures 1228a may route electrical signals in a direction in and out of the page from the perspective of FIG. 11. The via structures 1228b may be arranged to route electrical signals in a direction of a plane that is substantially perpendicular to the surface of the substrate 1202 upon which the device layer 1204 is formed. In some embodiments, the via structures 1228*b* may electrically couple trench structures 1228*a* of different interconnect layers 1206-1210 together.

At least some of the one or more interconnect layers 1206-1210, or/and parts of such layers, e.g., the interconnect structures 1228, may form the WWL, WBL, PL, and RBL lines described herein for coupling to the 2T-1AFE-CAP memory cells 100.

The interconnect layers 1206-1210 may include a dielectric material 1226 disposed between the interconnect structures 1228, as shown in FIG. 11. In some embodiments, the dielectric material 1226 disposed between the interconnect structures 1228 in different ones of the interconnect layers 1206-1210 may have different compositions; in other embodiments, the composition of the dielectric material 1226 between different interconnect layers 1206-1210 may be the same.

A first interconnect layer 1206 (referred to as Metal 1 or "M1") may be formed directly on the device layer 1204. In some embodiments, the first interconnect layer 1206 may include trench structures 1228*a* and/or via structures 1228*b*, as shown. The trench structures 1228*a* of the first interconnect layer 1206 may be coupled with contacts (e.g., the S/D contacts 1224) of the device layer 1204.

A second interconnect layer 1208 (referred to as Metal 2 or "M2") may be formed directly on the first interconnect layer 1206. In some embodiments, the second interconnect layer 1208 may include via structures 1228*b* to couple the trench structures 1228*a* of the second interconnect layer 1208 with the trench structures 1228*a* of the first interconnect layer 1206. Although the trench structures 1228*a* and the via structures 1228*b* are structurally delineated with a line within each interconnect layer (e.g., within the second interconnect layer 1208) for the sake of clarity, the trench structures 1228*a* and the via structures 1228*b* may be structurally and/or materially contiguous (e.g., simultaneously filled during a dual-damascene process) in some embodiments.

A third interconnect layer 1210 (referred to as Metal 3 or "M3") (and additional interconnect layers, as desired) may be formed in succession on the second interconnect layer 1208 according to similar techniques and configurations described in connection with the second interconnect layer 1208 or the first interconnect layer 1206.

The IC device 1200 may include a solder resist material 1234 (e.g., polyimide or similar material) and one or more bond pads 1236 formed on the interconnect layers 1206-1410. The bond pads 1236 may be electrically coupled with the interconnect structures 1228 and configured to route the electrical signals of the transistor(s) 1240 to other external devices. For example, solder bonds may be formed on the one or more bond pads 1236 to mechanically and/or electrically couple a chip including the IC device 1200 with another component (e.g., a circuit board). The IC device 1200 may have other alternative configurations to route the electrical signals from the interconnect layers 1206-1210 than depicted in other embodiments. For example, the bond pads 1236 may be replaced by or may further include other analogous features (e.g., posts) that route the electrical signals to external components.

Figure 12:
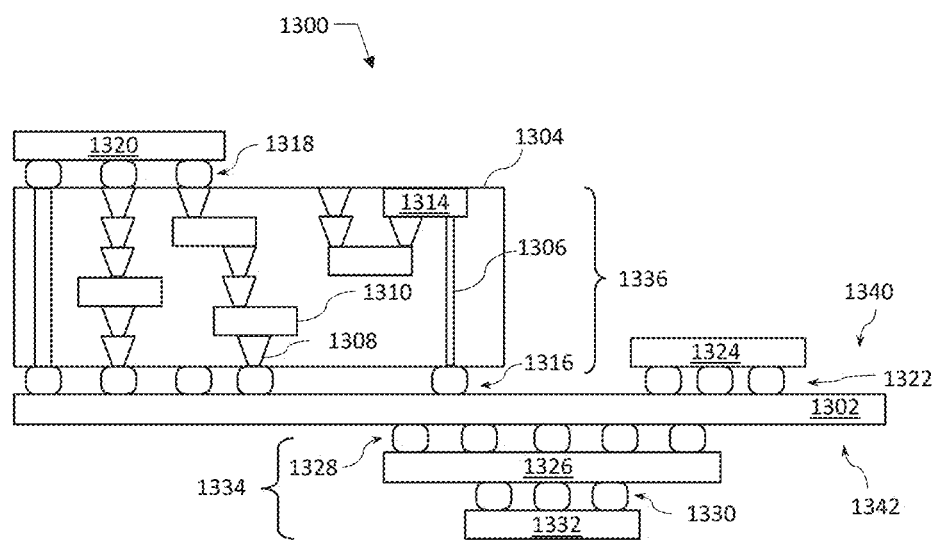
FIG. 12 is a cross-sectional side view of an IC device assembly that may include one or more AFE-CAP memory cells in accordance with any of the embodiments disclosed herein.

FIG. 12 is a cross-sectional side view of an IC device assembly 1300 that may include components having one or more AFE-CAP memory cells, e.g., one or more 2T-1AFE-CAP memory cells, in accordance with any of the embodiments disclosed herein. The IC device assembly 1300 includes a number of components disposed on a circuit board 1302 (which may be, e.g., a motherboard). The IC device assembly 1300 includes components disposed on a first face 1340 of the circuit board 1302 and an opposing second face 1342 of the circuit board 1302; generally, components may be disposed on one or both faces 1340 and 1342. In particular, any suitable ones of the components of the IC device assembly 1300 may include any of the AFE-CAP memory cells, and arrays of such cells, disclosed herein (e.g., in any of the 2T-1AFE-CAP memory cells 100, and arrays of such cells, disclosed herein).

In some embodiments, the circuit board 1302 may be a printed circuit board (PCB) including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 1302. In other embodiments, the circuit board 1302 may be a non-PCB substrate.

The IC device assembly 1300 illustrated in FIG. 12 includes a package-on-interposer structure 1336 coupled to the first face 1340 of the circuit board 1302 by coupling components 1316. The coupling components 1316 may electrically and mechanically couple the package-on-interposer structure 1336 to the circuit board 1302, and may include solder balls (as shown in FIG. 12), male and female portions of a socket, an adhesive, an underfill material, and/or any other suitable electrical and/or mechanical coupling structure.

The package-on-interposer structure 1336 may include an IC package 1320 coupled to an interposer 1304 by coupling components 1318. The coupling components 1318 may take any suitable form for the application, such as the forms discussed above with reference to the coupling components 1316. Although a single IC package 1320 is shown in FIG. 12, multiple IC packages 1320 may be coupled to the interposer 1304; indeed, additional interposers may be coupled to the interposer 1304. The interposer 1304 may provide an intervening substrate used to bridge the circuit board 1302 and the IC package 1320. The IC package 1320 may be or include, for example, a die (the die 1102 of FIG. 10B), an IC device (e.g., the IC device 1200 of FIG. 11), or any other suitable component. Generally, the interposer 1304 may spread a connection to a wider pitch or reroute a connection to a different connection. For example, the interposer 1304 may couple the IC package 1320 (e.g., a die) to a ball grid array (BGA) of the coupling components 1316 for coupling to the circuit board 1302. In the embodiment illustrated in FIG. 12, the IC package 1320 and the circuit board 1302 are attached to opposing sides of the interposer 1304; in other embodiments, the IC package 1320 and the circuit board 1302 may be attached to a same side of the interposer 1304. In some embodiments, three or more components may be interconnected by way of the interposer 1304.

The interposer 1304 may be formed of an epoxy resin, a fiberglass-reinforced epoxy resin, a ceramic material, or a polymer material such as polyimide. In some implementations, the interposer 1304 may be formed of alternate rigid or flexible materials that may include the same materials described above for use in a semiconductor substrate, such as silicon, germanium, and other group III-V and group IV materials. The interposer 1304 may include metal interconnects 1308 and vias 1310, including but not limited to through-silicon vias (TSVs) 1306. The interposer 1304 may further include embedded devices 1314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on the interposer 1304. The package-on-interposer structure 1336 may take the form of any of the package-on-interposer structures known in the art.

The IC device assembly 1300 may include an IC package 1324 coupled to the first face 1340 of the circuit board 1302 by coupling components 1322. The coupling components 1322 may take the form of any of the embodiments discussed above with reference to the coupling components 1316, and the IC package 1324 may take the form of any of the embodiments discussed above with reference to the IC package 1320.

The IC device assembly 1300 illustrated in FIG. 12 includes a package-on-package structure 1334 coupled to the second face 1342 of the circuit board 1302 by coupling components 1328. The package-on-package structure 1334 may include an IC package 1326 and an IC package 1332 coupled together by coupling components 1330 such that the IC package 1326 is disposed between the circuit board 1302 and the IC package 1332. The coupling components 1328 and 1330 may take the form of any of the embodiments of the coupling components 1316 discussed above, and the IC packages 1326 and 1332 may take the form of any of the embodiments of the IC package 1320 discussed above. The package-on-package structure 1334 may be configured in accordance with any of the package-on-package structures known in the art.

Figure 13:
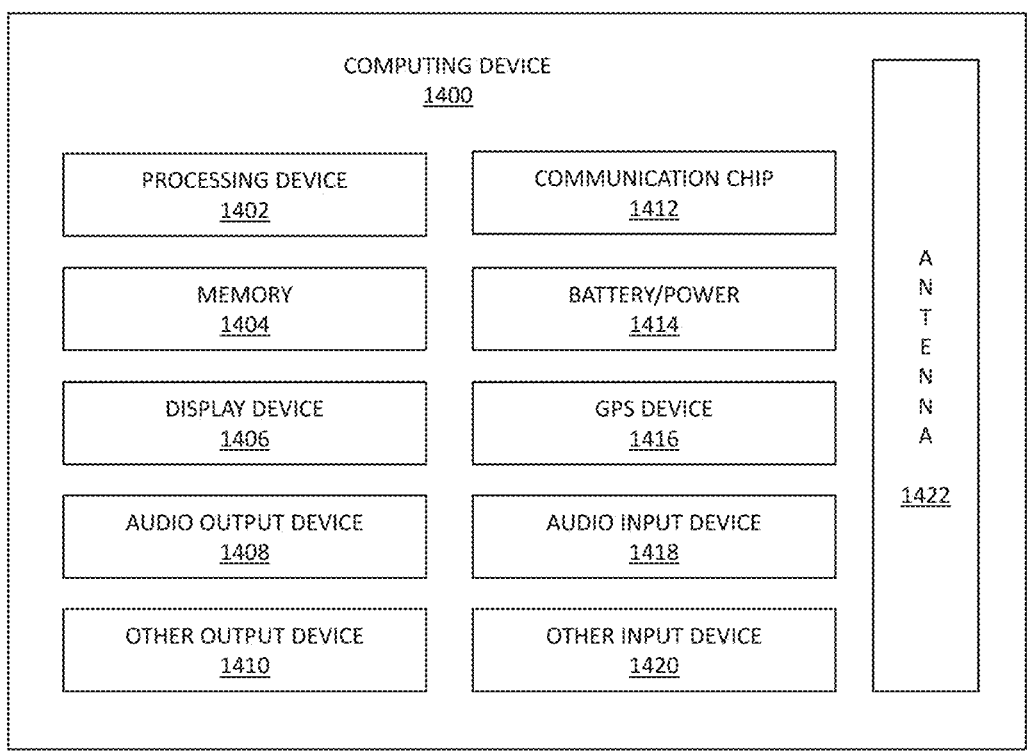
FIG. 13 is a block diagram of an example computing device that may include one or more AFE-CAP memory cells in accordance with any of the embodiments disclosed herein.

FIG. 13 is a block diagram of an example computing device 1400 that may include one or more components including one or more AFE-CAP memory cells, e.g., one or more 2T-1AFE-CAP memory cells, in accordance with any of the embodiments disclosed herein. For example, any suitable ones of the components of the computing device 1400 may include a die (e.g., the die 1102 (FIG. 10B)) having AFE capacitor(s) 106 forming one or more AFE-CAP memory cells, e.g., one or more 2T-1AFE-CAP memory cells 100. Any one or more of the components of the computing device 1400 may include, or be included in, an IC device 1200 (FIG. 11). Any one or more of the components of the computing device 1400 may include, or be included in, an IC device assembly 1300 (FIG. 12).

A number of components are illustrated in FIG. 13 as included in the computing device 1400, but any one or more of these components may be omitted or duplicated, as suitable for the application. In some embodiments, some or all of the components included in the computing device 1400 may be attached to one or more motherboards. In some embodiments, some or all of these components are fabricated onto a single system-on-a-chip (SoC) die.

Additionally, in various embodiments, the computing device 1400 may not include one or more of the components illustrated in FIG. 13, but the computing device 1400 may include interface circuitry for coupling to the one or more components. For example, the computing device 1400 may not include a display device 1406, but may include display device interface circuitry (e.g., a connector and driver circuitry) to which a display device 1406 may be coupled. In another set of examples, the computing device 1400 may not include an audio input device 1418 or an audio output device 1408, but may include audio input or output device interface circuitry (e.g., connectors and supporting circuitry) to which an audio input device 1418 or audio output device 1408 may be coupled.

The computing device 1400 may include a processing device 1402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 1402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 1400 may include a memory 1404, which may itself include one or more AFE-CAP memory cells, e.g., one or more 2T-1AFE-CAP memory cells as described herein. In general, the memory 1404 may include one or more memory devices such as volatile memory (e.g., DRAM), nonvolatile memory (e.g., read-only memory (ROM)), flash memory, solid state memory, and/or a hard drive. In some embodiments, the memory 1404 may include memory that shares a die with the processing device 1402. This memory may be used as cache memory and may include embedded DRAM (e-DRAM) or spin transfer torque magnetic random access memory (STT-MRAM).

In some embodiments, the computing device 1400 may include a communication chip 1412 (e.g., one or more communication chips). For example, the communication chip 1412 may be configured for managing wireless communications for the transfer of data to and from the computing device 1400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 1412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-805 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 1412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 1412 may operate in accordance with other wireless protocols in other embodiments. The computing device 1400 may include an antenna 1422 to facilitate wireless communications and/or to receive other wireless communications (such as AM or FM radio transmissions).

In some embodiments, the communication chip 1412 may manage wired communications, such as electrical, optical, or any other suitable communication protocols (e.g., the Ethernet). As noted above, the communication chip 1412 may include multiple communication chips. For instance, a first communication chip 1412 may be dedicated to shorter-range wireless communications such as Wi-Fi or Bluetooth, and a second communication chip 1412 may be dedicated to longer-range wireless communications such as GPS, EDGE, GPRS, CDMA, WiMAX, LTE, EV-DO, or others. In some embodiments, a first communication chip 1412 may be dedicated to wireless communications, and a second communication chip 1412 may be dedicated to wired communications.

The computing device 1400 may include battery/power circuitry 1414. The battery/power circuitry 1414 may include one or more energy storage devices (e.g., batteries or capacitors) and/or circuitry for coupling components of the computing device 1400 to an energy source separate from the computing device 1400 (e.g., AC line power).

The computing device 1400 may include a display device 1406 (or corresponding interface circuitry, as discussed above). The display device 1406 may include any visual indicators, such as a heads-up display, a computer monitor, a projector, a touchscreen display, a liquid crystal display (LCD), a light-emitting diode display, or a flat panel display, for example.

The computing device 1400 may include an audio output device 1408 (or corresponding interface circuitry, as discussed above). The audio output device 1408 may include any device that generates an audible indicator, such as speakers, headsets, or earbuds, for example.

The computing device 1400 may include an audio input device 1418 (or corresponding interface circuitry, as discussed above). The audio input device 1418 may include any device that generates a signal representative of a sound, such as microphones, microphone arrays, or digital instruments (e.g., instruments having a musical instrument digital interface (MIDI) output).

The computing device 1400 may include a global positioning system (GPS) device 1416 (or corresponding interface circuitry, as discussed above). The GPS device 1416 may be in communication with a satellite-based system and may receive a location of the computing device 1400, as known in the art.

The computing device 1400 may include an other output device 1410 (or corresponding interface circuitry, as discussed above). Examples of the other output device 1410 may include an audio codec, a video codec, a printer, a wired or wireless transmitter for providing information to other devices, or an additional storage device.

The computing device 1400 may include an other input device 1420 (or corresponding interface circuitry, as discussed above). Examples of the other input device 1420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 1400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 1400 may be any other electronic device that processes data.

Select Examples

The following paragraphs provide various examples of the embodiments disclosed herein.

Example 1 provides a memory cell that includes a storage node, a first and a second transistors, and an AFE capacitor. The storage node is configured to store a charge representative of one of a plurality of logic states. The first transistor is coupled to the storage node and configured to control charging or discharging of the storage node (i.e., the first transistor may be an access transistor for programming, or writing to, the memory cell). The second transistor is coupled to the storage node and configured to sense the charge on the storage node (i.e., the second transistor may be a read transistor for reading the memory cell). The AFE capacitor is coupled to the storage node, and includes a first capacitor electrode, a second capacitor electrode, and an AFE material between the first and second capacitor electrodes.

Example 2 provides the memory cell according to example 1, where a gate terminal of the first transistor is coupled to a write wordline (WWL) (i.e., the first transistor is controllable by the WWL).

Example 3 provides the memory cell according to examples 1 or 2, where a first source/drain (S/D) terminal of a pair of S/D terminals of the first transistor is coupled to the storage node.

Example 4 provides the memory cell according to example 3, where a second S/D terminal of the first transistor is coupled to a write bitline (WBL).

Example 5 provides the memory cell according to any one of the preceding examples, where a gate terminal of the second transistor is coupled to the storage node (i.e., the current in the second transistor depends on the charge on the storage node).

Example 6 provides the memory cell according to any one of the preceding examples, where a first source/drain (S/D) terminal of a pair of S/D terminals of the second transistor is coupled to a read bitline (RBL).

Example 7 provides the memory cell according to example 6, where a second S/D terminal of the second transistor is coupled to a negative or grounded supply voltage (source supply, VSS).

Example 8 provides the memory cell according to any one of the preceding examples, where the first capacitor electrode of the AFE capacitor is coupled to a PL.

Example 9 provides the memory cell according to any one of the preceding examples, where the second capacitor electrode of the AFE capacitor is coupled to the storage node.

Example 10 provides the memory cell according to example 9, where a gate terminal of the second transistor is coupled to the second capacitor electrode of the AFE capacitor via the storage node. Similarly, the first S/D terminal of the first transistor may be coupled to the second capacitor electrode of the AFE capacitor via the storage node.

Example 11 provides the memory cell according to any one of the preceding examples, where the storage node is programmable via the first transistor.

Example 12 provides the memory cell according to any one of the preceding examples, where the storage node is readable via the second transistor.

Example 13 provides the memory cell according to any one of the preceding examples, where at least one of the first transistor and the second transistor is a non-planar transistor in which a channel material of the non-planar transistor is shaped as a fin extending away from a base (e.g., substrate) and a gate stack of the non-planar transistor wraps around a portion of the fin that is farthest away from the base.

Example 14 provides the memory cell according to any one of the preceding examples, where the AFE material includes one or more of a material including hafnium and oxygen (e.g., hafnium oxide), such as a material including hafnium, zirconium, and oxygen (e.g., hafnium zirconium oxide) or a material including hafnium and oxygen (e.g., hafnium oxide) doped with one or more of silicon, aluminum, yttrium, gadolinium, germanium, lead, zirconium, titanium, tin, strontium, lanthanum, or niobium.

Example 15 provides the memory cell according to any one of the preceding examples, where the AFE material has a thickness between about 0.5 and 15 nanometers, including all values and ranges therein, e.g., between about 1 and 10 nanometers.

Example 16 provides a method of reading a memory cell that includes a storage node, a read transistor, and an AFE capacitor, the AFE capacitor including an AFE material between first and second capacitor electrodes. The method includes driving a PL, coupled to the first capacitor electrode of the AFE capacitor, to cause increase of a charge on the storage node, coupled to the second capacitor electrode of the AFE capacitor; and subsequently (i.e., after driving the PL) reading the memory cell by sensing a signal (e.g., a current or a voltage) on a read bitline (RBL) coupled to a first source/drain (S/D) terminal of a pair of S/D terminals of the read transistor to determine a logic state programmed on the memory cell, where the storage node is coupled to a gate terminal of the read transistor.

Example 17 provides the method according to example 16, further including, after the memory cell has been read, programming the memory cell to the logic state that was programmed on the memory cell prior to driving the PL to cause increase of the charge on the storage node. Thus, after the memory cell has been read using a read operation that changed the charge on the storage node, which charge represented the logic stated previously programmed on the memory cell, the memory cell may be programmed again (i.e., re-programmed) to return the charge on the storage node to substantially that charge that the storage node was charged to previously in order to program the memory cell to the logic state that was now determined/read with the read operation.

Example 18 provides the method according to example 17, where the memory cell further includes a write transistor, the write transistor including a gate terminal, coupled to a write wordline (WWL) (i.e., the write transistor is controllable by the WWL), a first S/D terminal, coupled to the storage node, and a second S/D terminal, coupled to a write bitline (WBL), and where programming the memory cell to the logic state includes driving the WWL to turn on the write transistor, and driving the WBL to charge the storage node to a charge that corresponds to the logic state.

Example 19 provides the method according to example 18, where at least one of the read transistor and the write transistor is a non-planar transistor in which a channel material of the non-planar transistor is shaped as a fin extending away from a base (e.g., substrate) and a gate stack of the non-planar transistor wraps around a portion of the fin that is farthest away from the base.

Example 20 provides the method according to any one of examples 16-19, where the AFE material includes one or more of a material including hafnium and oxygen (e.g., hafnium oxide), such as a material including hafnium, zirconium, and oxygen (e.g., hafnium zirconium oxide); and a material including hafnium and oxygen (e.g., hafnium oxide) doped with one or more of silicon, aluminum, yttrium, gadolinium, germanium, lead, zirconium, titanium, tin, strontium, lanthanum, or niobium.

In further examples, the memory cell read by the method according to any one of examples 16-20 includes a memory cell according to any one of examples 1-15.

Example 21 provides an apparatus (e.g., a computing device, a memory device, a processor, or any other electronic component) that includes an IC die that includes a memory device having a plurality of memory cells. Each memory cell includes a storage node, configured to store a charge representative of one of a plurality of logic states, and an AFE capacitor, coupled to the storage node, the AFE capacitor including a first capacitor electrode, a second capacitor electrode, and an AFE material between the first and second capacitor electrodes; and a further IC element coupled to the IC die.

Example 22 provides the apparatus according to example 21, where the further IC element is one of an interposer, a circuit board, a flexible board, or a package substrate.

Example 23 provides the apparatus according to examples 21 or 22, where each memory cell further includes a write transistor, coupled to the storage node and configured to control charging or discharging of the storage node, and a read transistor, coupled to the storage node and configured to sense the charge on the storage node after the charge has been enhanced by application of a voltage pulse to the AFE capacitor.

Example 24 provides the apparatus according to any one of examples 21-23, where the apparatus is a wearable or handheld device.

Example 25 provides the apparatus according to any one of examples 21-24, where the apparatus further includes one or more communication chips and an antenna.

In further examples, each memory cell of the apparatus according to any one of examples 21-25 includes a memory cell according to any one of examples 1-15, and/or is read using a method according to any one of examples 16-20.

Example 26 provides a computing device that includes a circuit board; a processing device coupled to the circuit board; and a memory device coupled to the processing device, wherein the memory device includes a plurality of memory cells arranged in an array, each memory cell including a storage node, configured to store a charge representative of one of a plurality of logic states, and an AFE capacitor, coupled to the storage node, the AFE capacitor including a first capacitor electrode, a second capacitor electrode, and an AFE material between the first and second capacitor electrodes.

Example 27 provides the computing device according to example 26, where the each memory cell further includes a first transistor, coupled to the storage node and configured to control charging or discharging of the storage node, and a second transistor, coupled to the storage node and configured to sense the charge on the storage node.

In further examples, each memory cell of the computing device according to any one of examples 26-27 includes a memory cell according to any one of examples 1-15, and/or is read using a method according to any one of examples 16-20.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

These modifications may be made to the disclosure in light of the above detailed description. The terms used in the following claims should not be construed to limit the disclosure to the specific implementations disclosed in the specification and the claims. Rather, the scope of the disclosure is to be determined entirely by the following claims, which are to be construed in accordance with established doctrines of claim interpretation.

The invention claimed is:

1. A memory cell, comprising:
a storage node, to store a charge representative of one of a plurality of logic states;
a first transistor, coupled to the storage node, to control charging or discharging of the storage node;
a second transistor, coupled to the storage node, to sense the charge on the storage node; and
a capacitor, coupled to the storage node, the capacitor comprising a first capacitor electrode, a second capacitor electrode, and an anti-ferroelectric (AFE) material between the first and second capacitor electrodes,
wherein the AFE material includes a material including hafnium and oxygen doped with one or more of silicon, aluminum, yttrium, gadolinium, germanium, lead, zirconium, titanium, tin, strontium, lanthanum, or niobium.

2. The memory cell according to claim 1, wherein a gate terminal of the first transistor is coupled to a write wordline.

3. The memory cell according to claim 1, wherein a first source/drain (S/D) terminal of the first transistor is coupled to the storage node.

4. The memory cell according to claim 3, wherein a second S/D terminal of the first transistor is coupled to a write bitline.

5. The memory cell according to claim 1, wherein a gate terminal of the second transistor is coupled to the storage node.

6. The memory cell according to claim 1, wherein a first source/drain (S/D) terminal of the second transistor is coupled to a read bitline.

7. The memory cell according to claim 6, wherein a second S/D terminal of the second transistor is coupled to a negative or grounded supply voltage.

8. The memory cell according to claim 1, wherein the first capacitor electrode is coupled to a plate-line.

9. The memory cell according to claim 1, wherein the second capacitor electrode is coupled to the storage node.

10. The memory cell according to claim 9, wherein a gate terminal of the second transistor is coupled to the second capacitor electrode via the storage node.

11. The memory cell according to claim 1, wherein the storage node is programmable via the first transistor.

12. The memory cell according to claim 1, wherein the storage node is readable via the second transistor.

13. The memory cell according to claim 1, wherein at least one of the first transistor and the second transistor is a non-planar transistor in which a channel material of the non-planar transistor is a fin and a gate stack of the non-planar transistor wraps around a portion of the fin.

14. The memory cell according to claim 1, wherein the AFE material has a thickness between 0.5 and 15 nanometers.

15. A method of reading a memory cell that includes a storage node, a read transistor, and a capacitor, the capacitor comprising an AFE material between first and second capacitor electrodes, the method comprising:
driving a plate-line (PL), coupled to the first capacitor electrode, to cause increase of a charge on the storage node, coupled to the second capacitor electrode; and
subsequently reading the memory cell by sensing a signal on a read bitline (RBL) coupled to a first source/drain (S/D) terminal of the read transistor to determine a logic state programmed on the memory cell, where the storage node is coupled to a gate terminal of the read transistor,
wherein the AFE material of the capacitor of the memory cell includes a material including hafnium and oxygen doped with one or more of silicon, aluminum, yttrium, gadolinium, germanium, lead, zirconium, titanium, tin, strontium, lanthanum, or niobium.

16. The method according to claim 15, further comprising:
after the memory cell has been read, programming the memory cell to the logic state that was programmed on the memory cell prior to driving the PL to cause increase of the charge on the storage node.

17. The method according to claim 16, wherein the memory cell further includes a write transistor, the write transistor comprising a gate terminal, coupled to a write wordline (WWL), a first S/D terminal, coupled to the storage node, and a second S/D terminal, coupled to a write bitline (WBL), and wherein programming the memory cell to the logic state comprises:
driving the WWL to turn on the write transistor, and
driving the WBL to charge the storage node to a charge that corresponds to the logic state.

18. The method according to claim 17, wherein at least one of the read transistor and the write transistor is a non-planar transistor in which a channel material of the non-planar transistor is a fin and a gate stack of the non-planar transistor wraps around a portion of the fin.

19. An apparatus, comprising:
an integrated circuit (IC) die, comprising a memory device that includes a plurality of memory cells, wherein an individual memory cell of the plurality of memory cells includes:
a storage node, to store a charge representative of one of a plurality of logic states, and
a capacitor, coupled to the storage node, the capacitor comprising a first capacitor electrode, a second capacitor electrode, and an anti-ferroelectric (AFE) material between the first and second capacitor electrodes,
wherein the AFE material includes a material including hafnium and oxygen doped with one or more of silicon, aluminum, yttrium, gadolinium, germanium, lead, zirconium, titanium, tin, strontium, lanthanum, or niobium; and
a further IC element coupled to the IC die.

20. The apparatus according to claim 19, wherein the further IC element is one of an interposer, a circuit board, a flexible board, or a package substrate.

21. A computing device, comprising:
a circuit board;
a processing device coupled to the circuit board; and
a memory device coupled to the processing device, wherein the memory device includes a plurality of memory cells arranged in an array, and wherein an individual memory cell of the plurality of memory cells includes:
a storage node, to store a charge representative of one of a plurality of logic states, and
a capacitor, coupled to the storage node, the capacitor comprising a first capacitor electrode, a second capacitor electrode, and an anti-ferroelectric (AFE) material between the first and second capacitor electrodes,
wherein the AFE material includes a material including hafnium and oxygen doped with one or more of silicon, aluminum, yttrium, gadolinium, germanium, lead, zirconium, titanium, tin strontium lanthanum or niobium.

22. The apparatus according to claim 19, wherein the individual memory cell further includes at least one of a first transistor, to control charging or discharging of the storage node, and a second transistor, to sense the charge on the storage node.

23. The apparatus according to claim 19, wherein the apparatus is a wearable or handheld device.

24. The apparatus according to claim 19, wherein the apparatus further includes one or more communication chips and an antenna.

25. The computing device according to claim 21, wherein the individual memory cell further includes at least one of a first transistor, to control charging or discharging of the storage node, and a second transistor, to sense the charge on the storage node.

* * * * *